(12) United States Patent
Wu et al.

(10) Patent No.: US 12,418,978 B2
(45) Date of Patent: Sep. 16, 2025

(54) ELECTRONIC DEVICE

(71) Applicant: InnoLux Corporation, Miao-Li County (TW)

(72) Inventors: Yuan-Lin Wu, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 256 days.

(21) Appl. No.: 18/095,542

(22) Filed: Jan. 11, 2023

(65) Prior Publication Data
US 2023/0262883 A1    Aug. 17, 2023

(30) Foreign Application Priority Data
Feb. 15, 2022 (CN) .......................... 202210137559.3

(51) Int. Cl.
*G06F 3/00* (2006.01)
*G06F 3/0354* (2013.01)
*G06F 3/041* (2006.01)
*G06F 3/046* (2006.01)
*H05K 1/02* (2006.01)

(52) U.S. Cl.
CPC ....... *H05K 1/0277* (2013.01); *G06F 3/03545* (2013.01); *G06F 3/0412* (2013.01); *G06F 3/046* (2013.01); *G06F 2203/04112* (2013.01)

(58) Field of Classification Search
None
See application file for complete search history.

(56) References Cited

U.S. PATENT DOCUMENTS

| | | | |
|---|---|---|---|
| 10,055,067 B2 * | 8/2018 | Shinkai | G06F 3/0445 |
| 11,315,527 B2 * | 4/2022 | Chida | G09G 5/36 |
| 12,045,406 B2 * | 7/2024 | Wu | G06F 3/041 |
| 2016/0202831 A1 * | 7/2016 | Kim | G06F 3/0446 |
| | | | 345/173 |
| 2017/0090517 A1 * | 3/2017 | Park | H05K 3/12 |
| 2018/0300006 A1 * | 10/2018 | Lim | G06F 3/044 |
| 2019/0107911 A1 * | 4/2019 | Zhai | G06F 3/0443 |
| 2020/0026332 A1 * | 1/2020 | Hong | G06F 3/044 |
| 2021/0134191 A1 * | 5/2021 | Jung | H10H 20/857 |
| 2021/0192983 A1 | 6/2021 | Sui | |
| 2022/0346239 A1 * | 10/2022 | Pi | H05K 1/0283 |

FOREIGN PATENT DOCUMENTS

| | | |
|---|---|---|
| CN | 110993679 A | 4/2020 |
| CN | 113451379 A | 9/2021 |
| TW | 1742977 B | 10/2021 |

* cited by examiner

*Primary Examiner* — Imani N Hayman
*Assistant Examiner* — Rashen E Morrison
(74) *Attorney, Agent, or Firm* — Winston Hsu

(57) ABSTRACT

An electronic device includes a stretchable substrate, a plurality of first electronic units and a plurality of second electronic units. The stretchable substrate has a plurality of island portions and a plurality of bridge portions, and each of the bridge portions connecting at least two of the island portions. The first electronic units are disposed on the island portions. The second electronic units are disposed on the stretchable substrate, each of the second electronic units includes a mesh pattern disposed on at least one of the island portions, and the mesh pattern includes a first opening overlapped with at least one of the first electronic units.

15 Claims, 13 Drawing Sheets

ELECTRONIC DEVICE

BACKGROUND OF THE DISCLOSURE

1. Field of the Disclosure

The present disclosure relates to an electronic device, and more particularly to an electronic device having a stretchable substrate.

2. Description of the Prior Art

As the evolution and development of electronic devices, the electronic devices have become an indispensable item. In order to make the electronic device be more widely used in various locations and situations (for example, to make the electronic device (e.g., a vehicle electronic device) be disposed on a curved surface or on an irregular object or to make the electronic device (e.g., a wearable electronic device) be worn on the human body), the industry is committed to developing a flexible electronic device and a stretchable electronic device to adapt to various locations and situations. In the designs of the flexible electronic device and the stretchable electronic device, since the bending, curling, stretching and other actions of the electronic device will affect the lifetime, the yield rate and the reliability of the electronic device, it is important to design a flexible electronic devices and a stretchable electronic device which have the long lifetime, the high yield rate, the high reliability and/or the multi-function.

SUMMARY OF THE DISCLOSURE

According to an embodiment, the present disclosure provides an electronic device including a stretchable substrate, a plurality of first electronic units and a plurality of second electronic units. The stretchable substrate has a plurality of island portions and a plurality of bridge portions, and each of the bridge portions connecting at least two of the island portions. The first electronic units are disposed on the island portions. The second electronic units are disposed on the stretchable substrate, each of the second electronic units includes a mesh pattern disposed on at least one of the island portions, and the mesh pattern includes a first opening overlapped with at least one of the first electronic units.

DETAILED DESCRIPTION

Figure 1:
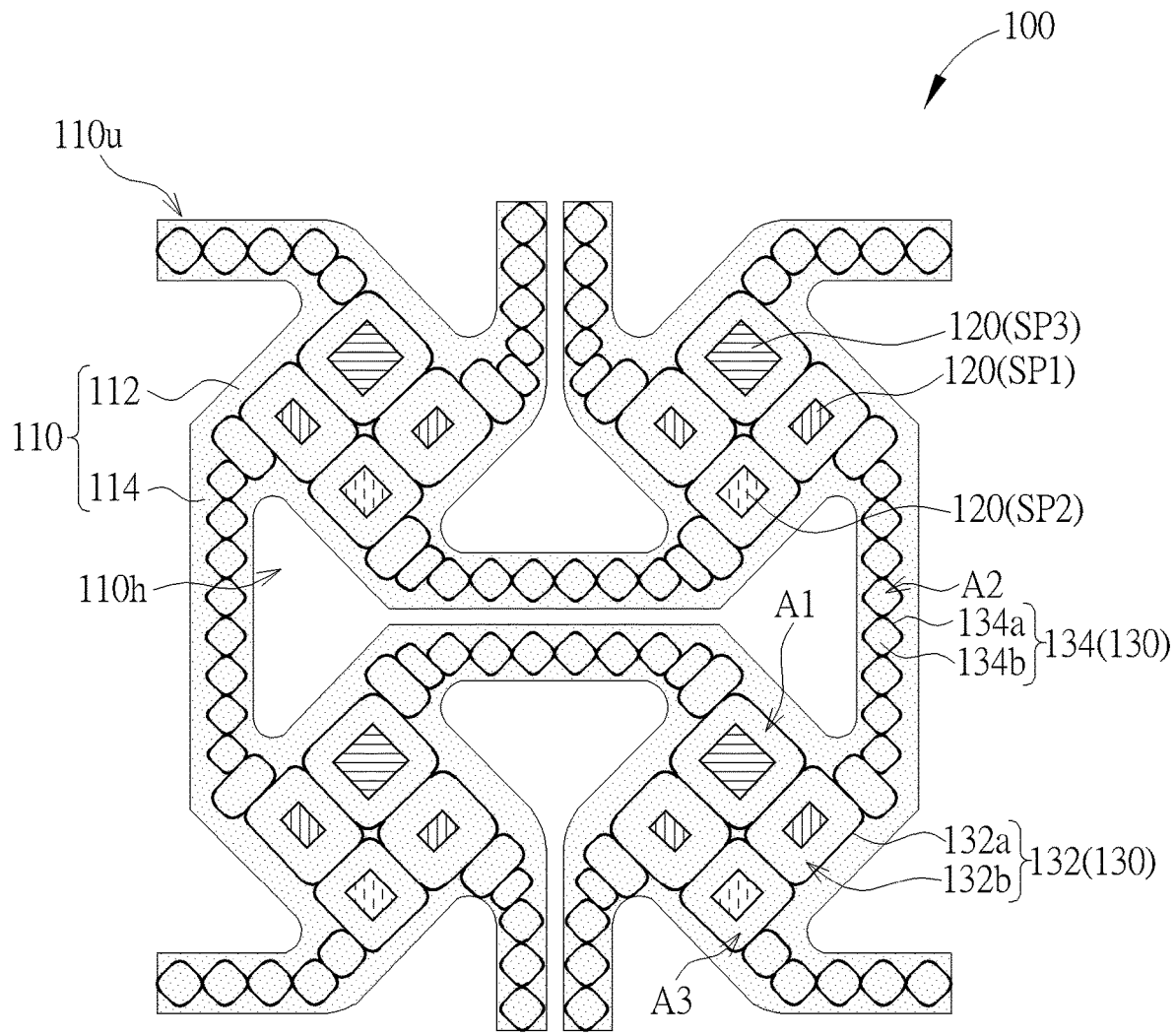
FIG. 1 and FIG. 2 are schematic diagrams showing a top view of a portion of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of a display device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component(s) may exist between them. On the other hand, when the component is referred to "directly on another component (or the variant thereof)", any component does not exist between them. Furthermore, when the corresponding component is referred to "on another component", the corresponding component and the another component have a disposition relationship along a top-view/vertical direction, the corresponding component may be below or above the another component, and the disposition relationship along the top-view/vertical direction are determined by an orientation of the device.

It will be understood that when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented. In addition, when the component is referred to "be coupled to/with another component (or the variant thereof)", it may be directly connected to this another component, or may be indirectly connected (such as electrically connected) to this another component through other component(s).

In the description and following claims, the term. "horizontal direction" generally means a direction parallel to a horizontal surface, the term "horizontal surface" generally means a surface parallel to a direction X and direction Y in the drawings, the term "vertical direction" generally means a direction parallel to a direction Z and perpendicular to the horizontal direction in the drawings, and the direction X, the direction Y and the direction Z are perpendicular to each other. In the description and following claims, the term "top view" generally means a viewing result viewing along the vertical direction. In the description and following claims, the term "cross-sectional view" generally means a viewing result viewing a structure cutting along the vertical direction and viewing along the horizontal direction.

In the description and following claims, it should be noted that the term "overlap" means that two elements overlap along the direction Z, and the term "overlap" can be "partially overlap" or "completely overlap" in unspecified circumstances. In the description and following claims, the term "parallel" means that an angle between two elements is less than or equal to the specific degree(s), such as 5 degrees, 3 degrees or 1 degree.

In the description and following claims, in a view (e.g., a top view), the term "surround" means that an element would completely surround or partially surround another element in unspecified circumstances. When "an element B completely surrounds an element C", whole outer edge(s) of the element C would be corresponding to the element B in its/their normal direction. When "an element B partially surrounds an element C", a cyclic structure of the element B configured to surround the element C has at least one gap, such that a part of the outer edge of the element C would not be corresponding to the element B in its normal direction.

The terms "about", "substantially", "equal", or "same" generally mean within ±20% of a given value or range, or mean within ±10%, ±5%, ±3%, ±2%, ±1%, or ±0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

According to an embodiment of the present disclosure, a width of the component, a thickness of the component, a height of the component, an area of the component or a distance between two components may be measured by an optical microscopy (OM), a scanning electron microscope (SEM), an Alpha step (α-step), ellipsometer or other suitable method, but not limited thereto. In detail, according to some embodiments, a cross-sectional image containing the component(s) desiring to be measured may be obtained by using the SEM, such that the width of the component, the thickness of the component, the height of the component, the area of the component or the distance between two components may be measured, and a volume of the component may be obtained by a suitable method (e.g., integral). In addition, any two values or directions used for comparison may have certain errors.

In the present disclosure, the electronic device may include a display device, a backlight device, an antenna device, a sensing device or a tiled device, but not limited thereto. The electronic device may be a foldable electronic device, a flexible electronic device or a stretchable electronic device. The display device may be a non-self-luminous type display device or a self-luminous type display device, the antenna device may be a liquid-crystal-type antenna device or a non-liquid-crystal-type antenna device, and the sensing device may be a device for sensing capacitance, light, thermal or ultrasonic, but not limited thereto. Electronic components may include passive component (s) and active component (s), such as capacitors, resistors, inductors, diodes and/or transistors. The diode may include a light emitting diode (LED) or a photodiode. The light emitting diode may include an organic light-emitting diode (OLED), a mini LED, a micro-LED, a quantum-dot LED (QLED, QDLED, but not limited thereto. The electronic device may include liquid crystal material, fluorescence material, phosphor material, quantum dot (QD) material or other suitable material based on requirement(s), but not limited thereto. Furthermore, the display device may be a color display device or a monochrome display device. The electronic device may have a peripheral system (such as a driving system, a control system, a light system, etc.) for supporting the display device, the backlight device, the antenna device, the sensing device or the tiled device. The tiled device may be a tiled display device or a tiled antenna device, but not limited thereto. A shape of the electronic device may be a polygon (e.g., a rectangle), a shape having a curved edge (e.g., a circle, an oval) or other suitable shape, but not limited thereto. Note that the electronic device may be any combination of the above, but not limited thereto. Hereinafter, the stretchable color display device will be used as the stretchable electronic device or the tiled device to illustrate the present disclosure, but the present disclosure is not limited thereto.

In the present disclosure, since the electronic device is stretchable, the electronic device may be used in a variety of situations. In some embodiments, the electronic device may be disposed on a curved surface or on an irregular object. For instance, the electronic device may be a vehicle electronic device disposed on such as windshield, window, rear mirror, instrument panel or steering wheel, but not limited thereto.

In some embodiments, the electronic device may be used in situations that require repeated stretching, wherein the electronic device may be such as a device with a push button and/or a wearable electronic device, but not limited thereto.

In the present disclosure, the electronic device may include an active region and a peripheral region, wherein the active region may optionally include a display region, a sensing region, a light-emitting region, a transceiver region and/or a working region based on the use of the electronic device, the peripheral region may be disposed on at least one outer side of the active region, and electronic components configured to assist the active region may be disposed in the peripheral region, but not limited thereto. For instance, the active region of the stretchable color display device of the present disclosure may include the display region and the sensing region, but not limited thereto.

Figure 2:
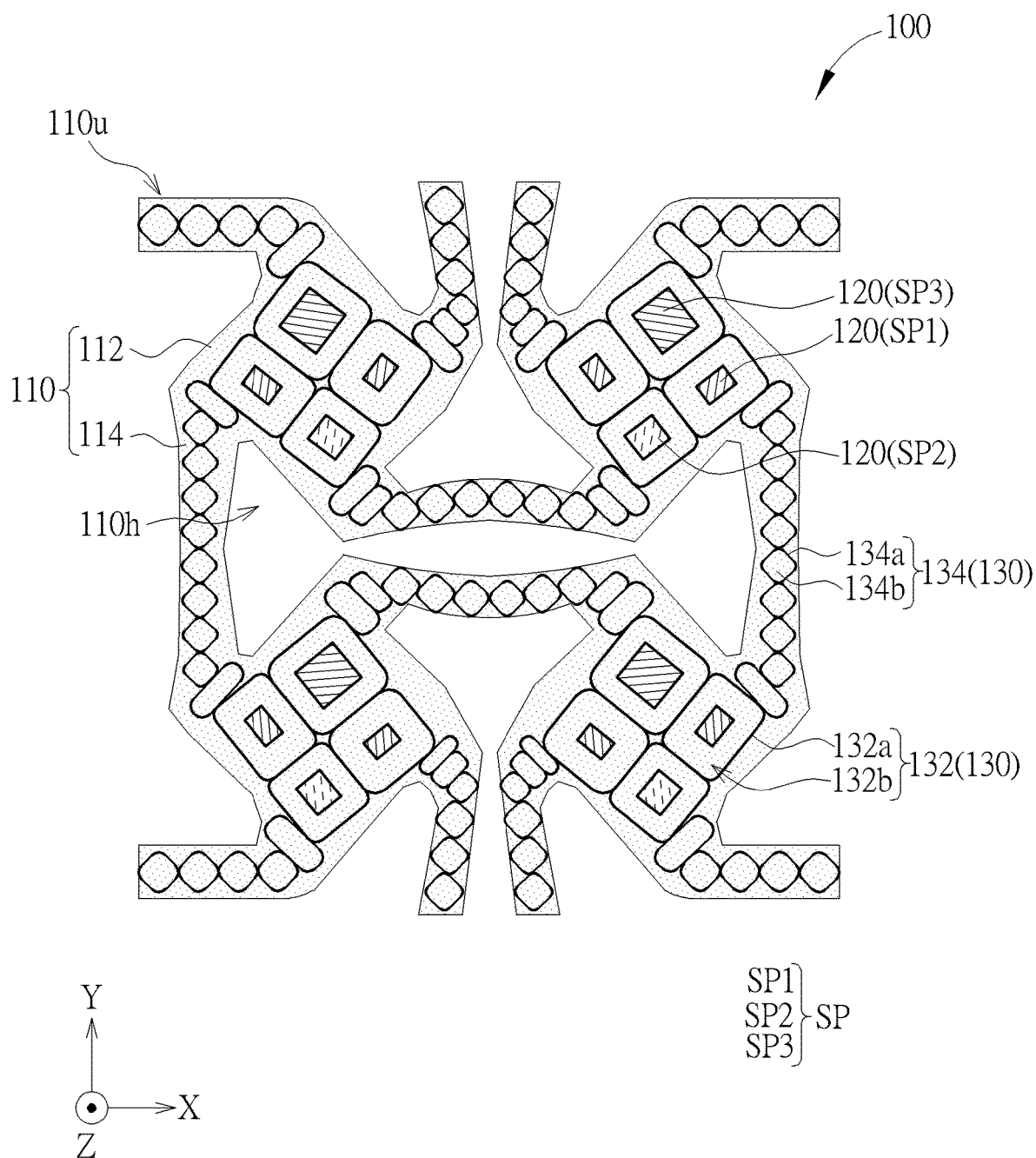
Figure 3:
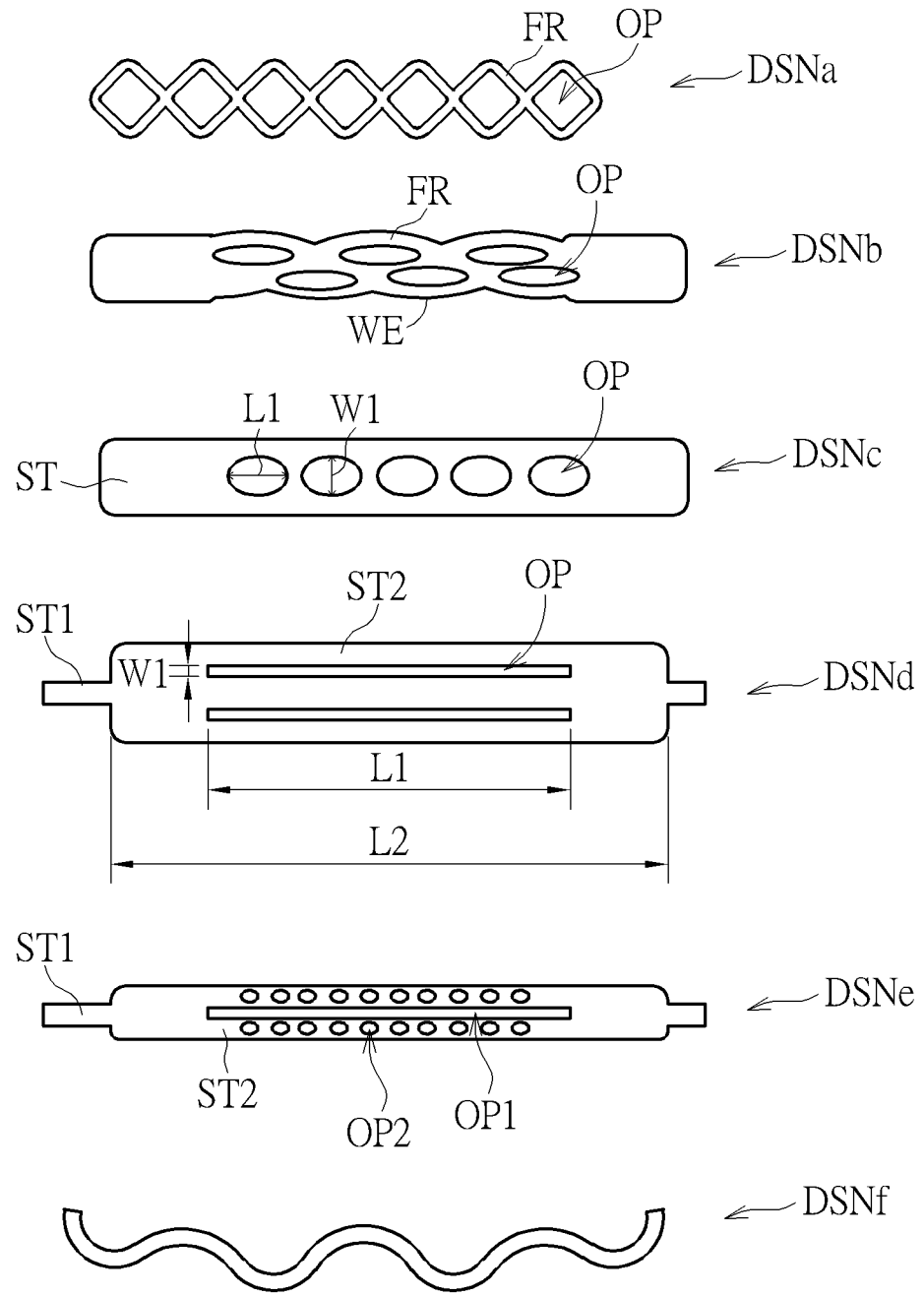
FIG. 3 is a schematic diagram showing a top view of disconnection-preventing designs according to some embodiments of the present disclosure.

Referring to FIG. 1 to FIG. 3, FIG. 1 and FIG. 2 are schematic diagrams showing a top view of a portion of an electronic device according to a first embodiment of the present disclosure, and FIG. 3 is a schematic diagram showing a top view of disconnection-preventing designs according to some embodiments of the present disclosure, wherein the structure shown in FIG. 1 is not stressed such that this structure is not stretched and deformed, and the structure shown in FIG. 2 is stressed such that this structure is stretched and/or deformed. As shown in FIG. 1, the electronic device 100 includes a stretchable substrate 110, wherein the stretchable substrate 110 may include any suitable rigid material and/or flexible material. For example, the stretchable substrate 110 may include glass, quartz, ceramic, sapphire, polyimide (PI), polyethylene terephthalate (PET), other suitable materials or a combination thereof. In the present disclosure, the direction X and the direction Y are perpendicular to a normal direction of the stretchable substrate 110, and the direction Z is parallel to the normal direction of the stretchable substrate 110.

In the present disclosure, the stretchable substrate 110 may have a patterned structure, so as to make the stretchable substrate 110 stretchable. Namely, even if the material of the stretchable substrate 110 is not stretchable or flexible (e.g., the rigid material), the stretchable substrate 110 may be stretchable due to the patterned structure. In the manufacture of the stretchable substrate 110, for example, a patterning process may be performed on a substrate to forma plurality of holes 110h, so as to manufacture the patterned structure, thereby forming the stretchable substrate 110.

In detail, the patterned structure of the stretchable substrate 110 may include a plurality of island portions 112 and a plurality of bridge portions 114, wherein each bridge portion 114 may be connected at least two of the island portions 112. For instance, FIG. 1 shows four island portions 112, each island portion 112 may be connected to four bridge portions 114, and the bridge portion 114 may be connected between two island portions 112, but not limited thereto. In the present disclosure, the shape of the island portion 112 and the shape of the bridge portion 114 may be designed based on requirement(s), wherein the shape may be such as a polygon (e.g., a rectangle), a shape having a curved edge (e.g., a circle, an oval) or other suitable shape. For example, in FIG. 1, the island portion 112 may be a quadrangle, and the bridge portion 114 may be a strip structure, but not limited thereto. In the present disclosure, the arrangement of the island portions 112 and the arrangement of the bridge portions 114 may be designed based on requirement(s). For example, in FIG. 1, the island portions 112 may be arranged in rows along the direction X and in columns along the direction Y, some bridge portions 114 may extend along the direction X, and some bridge portions 114 may extend along the direction Y, but not limited thereto. Note that, in some embodiments, an edge of the connection between the bridge portion 114 and the island portion 112 may be a curved edge (e.g., a circular arc) for example, so as to improve the reliability of the stretchable substrate 110 when the stretchable substrate 110 is operated (e.g., stretched and/or deformed), but not limited thereto.

In some embodiments, the stretchable substrate 110 may have a plurality of substrate units 110u, each substrate unit 110u may include at least one island portion 112 and at least one bridge portion 114, and the number of the island portion(s) 112 included in the substrate unit 110u and the number of the bridge portion(s) 114 included in the substrate unit 110u may be designed based on requirement(s). For instance, in FIG. 1, each substrate unit 110u may include four island portions 112 arranged in a 2×2 array and twelve bridge portions 114 directly connected to these island portions 112 (four bridge portions 114 are connected between these island portions 112, and each of one ends of other eight bridge portions 114 is connected to the island portion 112 of another substrate unit 110u), but not limited thereto. That is to say, FIG. 1 shows one substrate unit 110u, but not limited thereto. In some embodiments (as shown in FIG. 1), the substrate unit 110u may have a symmetrical top-view pattern, but not limited thereto. In some embodiments (as shown in FIG. 1), four island portions 112 arranged in the 2×2 array and four bridge portions 114 directly connected between these island portions 112 may surround the H-shaped hole 110h of the stretchable substrate 110, and the top view pattern of two ends of the H-shaped hole 110h may be similar to a triangle, but not limited thereto.

As shown in FIG. 2, since the patterned structure including the island portions 112 and the bridge portions 114 exists in the stretchable substrate 110, the stretchable substrate 110 may be stretched and/or deformed by applying force. For example, in FIG. 2, in the case of applying force to the stretchable substrate 110, the island portion 112 may be rotated (e.g., in top view), and the bridge portion 114 may be deformed, so as to make the stretchable substrate 110 be stretched, but not limited thereto.

In some embodiments, pixels configured to display an image may be disposed on the island portions 112, wherein the pixel may include at least one sub-pixel SP. In some embodiments, if the electronic device 100 is a color display device, one pixel may include a plurality of sub-pixels SP for instance, such as a green sub-pixel, a red sub-pixel and a blue sub-pixel, but not limited thereto. The number and color of the sub-pixel(s) SP included in the pixel may be adjusted based on requirement(s). In some embodiments, if the electronic device 100 is a monochrome display device, one pixel may include one sub-pixel SP for instance, but not limited thereto. For instance, in the electronic device 100 (the stretchable color display device) shown in FIG. 1, one island portion 112 may have one pixel, and each pixel may include two green sub-pixels SP1, one red sub-pixel SP2 and one blue sub-pixel SP3, but not limited thereto.

The electronic device 100 includes a plurality of first electronic units 120 disposed on the island portions 112 of the stretchable substrate 110, wherein the first electronic unit 120 may include may include an active component, such as a thin film transistor, a light emitting diode, a photodiode or other suitable active component. In some embodiments, the first electronic unit 120 may be the active component disposed in the sub-pixel SP (e.g., the active component may be a light emitting component), and one sub-pixel SP may include one first electronic unit 120 or a plurality of first electronic units 120, but not limited thereto.

In the present disclosure, the light emitting component (e.g., the light emitting diode) disposed in the sub-pixel SP may provide the light having the corresponding light-intensity based on the received voltage and/or the received current, and the received voltage and/or the received current of the light emitting component may be related to such as a gray level signal (provided by an integrated chip or provided from outer device), thereby displaying the image. Namely, the intensity of the light generated by the light emitting component is related to the gray level of a region of the display image corresponding to this light emitting component.

The color of the light emitted from the light emitting component may be designed based on requirement(s). For example, the color or the light emitted from the light emitting component may be based on the sub-pixel SP where this light emitting component is disposed, wherein the emitting light may be red light, green light or blue light, but not limited thereto. In some embodiments, all of the light emitting component may emit the same color light, and the electronic device 100 may further include a light converting layer (not shown in figures) disposed on the light emitting component, so as to convert (or filter) the light emitted from the light emitting component into another light with different color. The light converting layer may include color filter, quantum dots (QD) material, fluorescence material, phosphorescence material, other suitable material(s) or a combination thereof. For instance, the light emitting component may emit white light, the light converting layer may convert the white light into another color light which the sub-pixel SP needs, such as red light, green light or blue light, but not limited thereto. For instance, the light emitting component may emit blue light, the light converting layer may convert the blue light into another color light which the sub-pixel SP needs, such as red light or green light, or may not convert to maintain the blue light, but not limited thereto.

The photodiode may generate an electrical signal (e.g., voltage or current) according to the received light, and the generated electrical signal may be used to perform related applications, such as power generation, light sensing, etc.

The transistor may be a top gate thin film transistor, a bottom gate thin film transistor, a dual gate thin film transistor or other suitable transistor, but not limited thereto. In some embodiments, the transistor may be electrically connected to the light emitting component (e.g., the light emitting diode) in the sub-pixel SP, so as to control the received voltage and/or the received current of the light emitting component, but not limited thereto.

The electronic device 100 may include a plurality of second electronic units 130 disposed on the stretchable substrate 110, wherein the second electronic unit 130 may include a passive component, such as a resistor, a capacitor, an inductor, a trace, an electrode (e.g., a sense electrode) or other suitable passive component. In some embodiments, the second electronic unit 130 may include may include the touch electrode and/or the trace (e.g., a touch sensing trace), such that the second electronic unit 130 may be configured to sense a touch object (e.g., a finger, a stylus pen, etc.) touching the electronic device 100, so as to be any suitable touch sensor (e.g., a capacitive touch sensor or a resistive touch sensor), but not limited thereto. In some embodiments, the second electronic unit 130 may include a signal transceiver component (e.g., an antenna component), such that the second electronic unit 130 may be configured to receive or emit the electromagnetic wave, so as to make the electronic device 100 have an antenna function, but not limited thereto.

In the present disclosure, the second electronic unit 130 may be a single-layer structure or a multi-layer structure. In some embodiments, the second electronic unit 130 may be a single-layer structure including one conductive layer, but not limited thereto. In some embodiments, the second electronic unit 130 may be a multi-layer structure including a plurality of conductive layers and an insulating layer disposed between two conductive layers, but not limited thereto. In some embodiments, a portion of the second electronic unit 130 may be a single-layer structure, another portion of the second electronic unit 130 may be a multi-layer structure, but not limited thereto. In the present disclosure, the material of the conductive layer may include such as metal, transparent conductive material (such as indium tin oxide (ITO), indium zinc oxide (IZO), etc.), other suitable conductive materials or a combination thereof, and the material of the insulating layer may include such as silicon oxide ($SiO_x$), silicon nitride ($SiN_y$), silicon oxynitride ($SiO_xN_y$), organic insulating material (e.g., photosensitive resin), other suitable insulating materials or a combination thereof, but not limited thereto. For instance, the material of the conductive layer included in the second electronic unit 130 may be metal, but not limited thereto. In addition, the first electronic unit 120 and the second electronic unit 130 may be disposed on the same side of the stretchable substrate 110 or different sides of the stretchable substrate 110 based on requirement(s).

In the present disclosure, the disposing range of each second electronic unit 130 may be designed based on requirement(s). For instance, in FIG. 1, there is a one-to-one correspondence between the second electronic unit 130 and substrate unit 110$u$ of the stretchable substrate 110 (i.e., one second electronic unit 130 is disposed on one substrate unit 110$u$), but not limited thereto.

In some embodiments, the pattern of the second electronic unit 130 may have a disconnection-preventing design based on requirement(s), so as to reduce the disconnection possibility of the second electronic unit 130 when the electronic device 100 is stretched and/or deformed, thereby increasing the reliability of the electronic device 100 when the electronic device 100 is stretched and/or deformed. In actual design, the pattern of the second electronic unit 130 may be designed based on the stretching amount, the deformation degree and/or the bending curvature of the electronic device 100.

FIG. 3 shows some embodiments of the disconnection-preventing design, but the disconnection-preventing design of the present disclosure is not limited thereto. The disconnection-preventing design may be a combination of the designs shown in FIG. 3 or other suitable design. In some embodiments (as shown in FIG. 3), the pattern of the disconnection-preventing design may include an opening OP, and the opening OP may be in a shape of a polygon (e.g., a rectangle, a rhombus, a bar), a shape having a curved edge (e.g., a circle, an oval) or other suitable shape. In some embodiments, the shape of the opening OP may be a polygon with chamfers, wherein the existence of the chamfer may enhance the reliability of the electronic device 100 when the electronic device 100 is stretched and/or deformed. In the present disclosure, an area of the opening OP may be designed based on requirement(s).

For example, in the disconnection-preventing design DSNa shown in FIG. 3, the disconnection-preventing design DSNa may include a frame FR surrounding the opening OP (e.g., the opening OP may have, but not limited to, a rectangle pattern), and the disconnection-preventing design DSNa may be formed by connecting the frames FR in series (e.g., the opening OP may be arranged in a row), but not limited thereto. For example, in the disconnection-preventing design DSNb shown in FIG. 3, the disconnection-preventing design DSNb may include a frame FR surrounding the opening OP (e.g., the opening OP may have, but not limited to, an oval pattern), the frames FR may be connected to each other to make the disconnection-preventing design DSNb have a wavy outer edge WE, the opening OP may be arranged in rows (the disconnection-preventing design DSNb of FIG. 3 has two rows of the opening OP), and the openings OP in different rows may be staggered, but not limited thereto. For example, in the disconnection-preventing design DSNc shown in FIG. 3, the disconnection-preventing design DSNc may be a strip structure ST including at least one opening OP (e.g., the opening OP may have, but not limited to, a circle pattern or an oval pattern), wherein the opening OP may be arranged in at least one row. In some embodiments (e.g., the disconnection-preventing design DSNa, the disconnection-preventing design DSNb and the disconnection-preventing design DSNc), the area of the opening OP may be greater than or equal to 1 $\mu m^2$ and less than or equal to 50 $\mu m^2$ (i.e., 1 $\mu m^2 \leq$ the area of the opening OP$\leq$50 $\mu m^2$), so as to increase the reliability of the electronic device 100 when the electronic device 100 is stretched and/or deformed, but not limited thereto. In some embodiments (e.g., the disconnection-preventing design DSNa, the disconnection-preventing design DSNb and the disconnection-preventing design DSNc), in one opening OP, a ratio of a length L1 to a width W1 may be greater than or equal to 1 and less than or equal to 5 (i.e., $1 \leq L1/W1 \leq 5$), so as to increase the reliability of the electronic device 100 when the electronic device 100 is stretched and/or deformed, but not limited thereto. Note that, in the present disclosure, the length L1 is measured along a direction parallel to an extension direction (a length direction) of the strip structure ST, and the width W1 is measured along a direction perpendicular to the extension direction (the length direction) of the strip structure ST.

In some embodiments, the disconnection-preventing design DSNd and the disconnection-preventing design DSNe shown in FIG. 3 may have a forking structure, so as to make one strip pattern ST1 be divided into a plurality of branched strip patterns ST2. In the disconnection-preventing design DSNd, one strip pattern ST1 may be divided into three branched strip patterns ST2, and the opening OP (e.g., the opening OP may have a rectangle pattern or a bar pattern) may be disposed between two adjacent branched strip patterns ST2 among in the three branched strip patterns ST2, but not limited thereto. In the disconnection-preventing design DSNe, one strip pattern ST1 may be divided into two branched strip patterns ST2, and the opening OP1 (e.g., the opening OP1 may have a rectangle pattern or a bar pattern) may be disposed between two branched strip patterns ST2. Since the disconnection-preventing design DSNd and the disconnection-preventing design DSNe have the forking structure, even if one of the branched strip patterns ST2 breaks during the stretching process of the electronic device 100, the electrical signal may still be transmitted through other branched strip pattern(s) ST2, thereby decreasing the possibility of disconnection when the electronic device 100 is stretched or deformed. In some embodiments (e.g., the disconnection-preventing design DSNd and the disconnection-preventing design DSNe), a ratio of a length L2 of the branched strip pattern ST2 to a length L1 of the opening OP (or opening OP1) may be greater than or equal to 1 and less than or equal to 2 (i.e., $1 \leq L2/L1 \leq 2$), so as to increase the reliability of the electronic device 100 when the electronic device 100 is stretched and/or deformed, but not limited thereto. In some embodiments (e.g., the disconnection-preventing design DSNd and the disconnection-preventing design DSNe), in one opening OP (or opening OP1), a ratio of the length L1 to a width W1 may be greater than or equal to 50 and less than or equal to 1000 (i.e., $50 \leq L1/W1 \leq 1000$), so as to increase the reliability of the electronic device 100 when the electronic device 100 is stretched and/or deformed, but not limited thereto. Note that, in the present disclosure, the length L1 is measured along a direction parallel to an extension direction (a length direction) of the branched strip structure ST2, and the width W1 is measured along a direction perpendicular to the extension direction (the length direction) of the branched strip structure ST2.

Furthermore, the disconnection-preventing design may have multiple types of openings. For instance, the disconnection-preventing design DSNe may have the opening OP1 having a bar pattern (or a rectangle pattern) and the opening OP2 having a circle pattern, and the opening OP2 having the circle pattern may be disposed in the branched strip pattern ST2, so as to increase the reliability of the electronic device 100 when the electronic device 100 is stretched and/or deformed, but not limited thereto. In addition, the disconnection-preventing design may optionally have a gap without affecting the transmission of the electrical signal, so as to improve the disconnection-preventing effect.

In some embodiments (as shown in FIG. 3), the pattern of the disconnection-preventing design DSNf may have a wavy shape, so as to enhance the stretchable property of the disconnection-preventing design DSNf, thereby increasing the reliability of the electronic device 100 when the electronic device 100 is stretched and/or deformed, but not limited thereto.

In the present disclosure, each second electronic unit 130 may include a mesh pattern 132 disposed on the island portion 112, wherein the mesh pattern 132 may optionally have the disconnection-preventing design (i.e., the mesh pattern 132 may include one of the disconnection-preventing designs shown in FIG. 3, a combination of the disconnection-preventing designs shown in FIG. 3 or other suitable disconnection-preventing design), so as to decrease the possibility of disconnection of the mesh pattern 132 when the electronic device 100 is stretched and/or deformed, thereby increasing the reliability of the electronic device 100 when the electronic device 100 is stretched and/or deformed. In FIG. 1, the mesh pattern 132 may include a first frame 132a and a first opening 132b, the first frame 132a may surround (completely surround or partially surround) the first opening 132b, and the first opening 132b may overlap at least one first electronic unit 120. Therefore, in FIG. 1, the first frame 132a may surround at least one first electronic unit 120, and the first frame 132a may not overlap the first electronic unit 120. In the present disclosure, the first frame 132a of the second electronic unit 130 may have a closed pattern or a non-closed pattern based on requirement(s), so as to completely surround or partially surround the first opening 132b. In the present disclosure, the first frame 132a of the mesh pattern 132 of the second electronic unit 130 may include a conductive material (e.g., the conductive material may be, but not limited to, metal). In the present disclosure, the shape of the first frame 132a and the shape of the first opening 132b may be designed to be any suitable shape based on requirement(s). For example, the shape of the first frame 132a and the shape of the first opening 132b may be a polygon (e.g., a rectangle, a rhombus, a bar), a shape having a curved edge (e.g., a circle, an oval), but not limited thereto. In some embodiments, the shape of the first frame 132a and the shape of the first opening 132b may be a polygon with chamfers, so as to increase the reliability of the electronic device 100 when the electronic device 100 is stretched and/or deformed.

In the present disclosure, the distribution of the mesh pattern(s) 132 of the second electronic unit 130 on the substrate unit 110u may be designed based on requirement (s), such that the mesh pattern(s) 132 may be disposed on one island portion 112 or a plurality of island portions 112 of the substrate unit 110u. In some embodiments, the mesh patterns 132 of the second electronic unit 130 may be disposed on at least two island portions 112 of the substrate unit 110u. For example, in FIG. 1, the mesh patterns 132 of the second electronic unit 130 may be disposed on all island portions 112 of the substrate unit 110u, but not limited thereto. Moreover, one mesh pattern 132 or a plurality of mesh patterns 132 may be disposed on one island portion 112. For example, in FIG. 1, four mesh patterns 132 may be disposed on one island portion 112, but not limited thereto.

Each second electronic unit 130 may include a connection pattern 134 disposed on the bridge portion 114, wherein the connection pattern 134 may be configured to be electrically connected to the mesh patterns 132 on two adjacent island portions 112, and the pattern of the connection pattern 134 may be designed based on requirement(s). In some embodiments, the pattern of the connection pattern 134 may have the disconnection-preventing design (i.e., the connection pattern 134 may include one of the disconnection-preventing designs shown in FIG. 3, a combination of the disconnection-preventing designs shown in FIG. 3 or other suitable disconnection-preventing design), so as to decrease the possibility of disconnection of the connection pattern 134 when the electronic device 100 is stretched and/or deformed, thereby increasing the reliability of the electronic device 100 when the electronic device 100 is stretched and/or deformed.

In some embodiments (as shown in FIG. 1), the connection pattern 134 may include a second frame 134a and a second opening 134b, wherein the shape of the second opening 134b may be a polygon (e.g., a rectangle, a rhombus, a bar), a shape having a curved edge (e.g., a circle, an oval) or other suitable shape, and the second frame 134a may surround (completely surround or partially surround) the second opening 134b. In the present disclosure, the second frame 134a may have a closed pattern or a non-closed pattern based on requirement (s), so as to completely surround or partially surround the second opening 134b. For instance, the shape of the second frame 134a and the shape of the second opening 134b may be a polygon (e.g., a rectangle) with chamfers, and the connection pattern 134 may be formed by connecting the second frames 134a in series, so as to increase the reliability of the electronic device 100 when the electronic device 100 is stretched and/or deformed, but not limited thereto.

Under the condition that the connection pattern 134 has the second opening 134b, the area relationship between the first opening 132b of the mesh pattern 132 and the second opening 134b of the connection pattern 134 may be designed based on requirement(s). In FIG. 1, the first opening 132b has a first area A1, the second opening 134b has a second area A2, and the first area A1 may be greater than the second area A2. For example, a ratio of the first area A1 to the second area A2 may be greater than 50 and less than or equal to 5000 (i.e., $50<A1/A2\leq5000$), so as to increase the reliability of the electronic device 100 when the electronic device 100 is stretched and/or deformed, but not limited thereto. Furthermore, optionally, the areas of the first openings 132b of the mesh patterns 132 on the same island portion 112 may be the same or different from each other based on requirement(s). For instance, in one island portion 112 shown in FIG. 1, the greatest first opening 132b and the smallest first opening 132b (or referred as a third opening) respectively overlaps different first electronic units 120, and a ratio of an area of the greatest first opening 132b (e.g., the first area A1) to an area of the smallest first opening 132b (or referred as a third area A3 of the third opening) may be greater than 1 and less than or equal to 5 (i.e., $1<A1/A3\leq5$), but not limited thereto. For example, the areas of the first openings 132b of the mesh patterns 132 on the same the island portion 112 may be the same (i.e., the first area A1 and the third area A3 are the same), but not limited thereto.

In some embodiments (not shown in figures), the connection pattern 134 may have the wavy shape, so as to enhance the stretchable property of the connection pattern 134, thereby increasing the reliability of the electronic device 100 when the electronic device 100 is stretched and/or deformed, but not limited thereto.

In some embodiments, the connection patterns 134 located at different positions in one second electronic unit 130 may have different pattern designs. For instance (not shown in figures), in one substrate unit 110u, the connection pattern 134 having the disconnection-preventing design DSNa shown in FIG. 3 may be disposed on one bridge portion 114, the connection pattern 134 having the disconnection-preventing design DSNf shown in FIG. 3 may be disposed on another bridge portion 114, but not limited thereto. In addition, the connection pattern 134 may be designed based on the stretching amount, the deformation degree and/or the bending curvature of the electronic device 100. For instance, if the electronic device 100 has the greater stretching amount and/or the greater deformation degree in the direction X, and the electronic device 100 is not stretched and deformed in the direction Y, the connection pattern 134 on the bridge portion 114 extending along the direction X may have the disconnection-preventing design, and the connection pattern 134 on the bridge portion 114 extending along the direction Y may not have the disconnection-preventing design, but not limited thereto.

In the present disclosure, the distribution of the connection pattern(s) 134 of the second electronic unit 130 on the substrate unit 110u may be designed based on requirement(s), such that the connection pattern(s) 134 may be disposed on one bridge portion 114 or a plurality of bridge portions 114 of the substrate unit 110u. For instance, as shown in FIG. 1, the connection patterns 134 may be disposed on each bridge portion 114 of the substrate unit 110u corresponding to the second electronic unit 130, but not limited thereto. For instance (not shown in figures), the connection pattern(s) 134 may be disposed on at least one bridge portion 114 of the substrate unit 110u corresponding to the second electronic unit 130, and the connection pattern 134 may not be disposed on at least another one bridge portion 114 of the substrate unit 110u corresponding to the second electronic unit 130, but not limited thereto.

When the force is applied on the stretchable substrate 110 to make the stretchable substrate 110 stretched and/or deformed, at least a portion of the pattern of the second electronic unit 130 may be deformed. For example, in FIG. 2, when the island portion 112 is rotated due to the applying force, the connection pattern 134 of the second electronic unit 130 is deformed at the connection connected to the mesh pattern 132. In some embodiments, the deformed portion of the second electronic unit 130 may have a pattern more adaptable to the deformation. For instance, the deformed portion of the second electronic unit 130 may have a greater opening, or the pattern of the deformed portion of the second electronic unit 130 may be designed based on the direction and/or curvature of the deformation of the part of the stretchable substrate 110 corresponding to the deformed portion.

Figure 4:
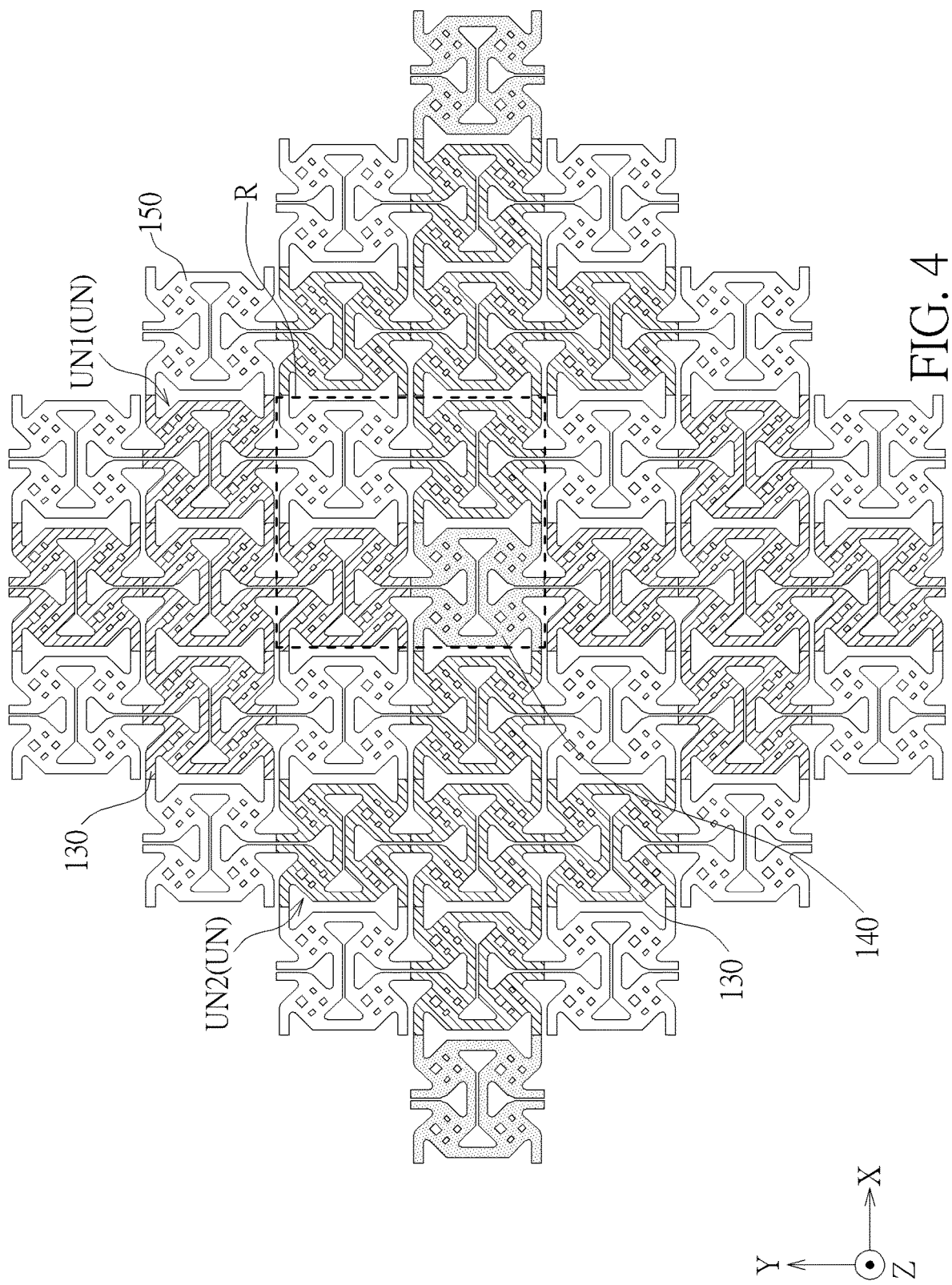
FIG. 4 is a schematic diagram showing a top view of a portion of the electronic device according to the first embodiment of the present disclosure.
Figure 5:
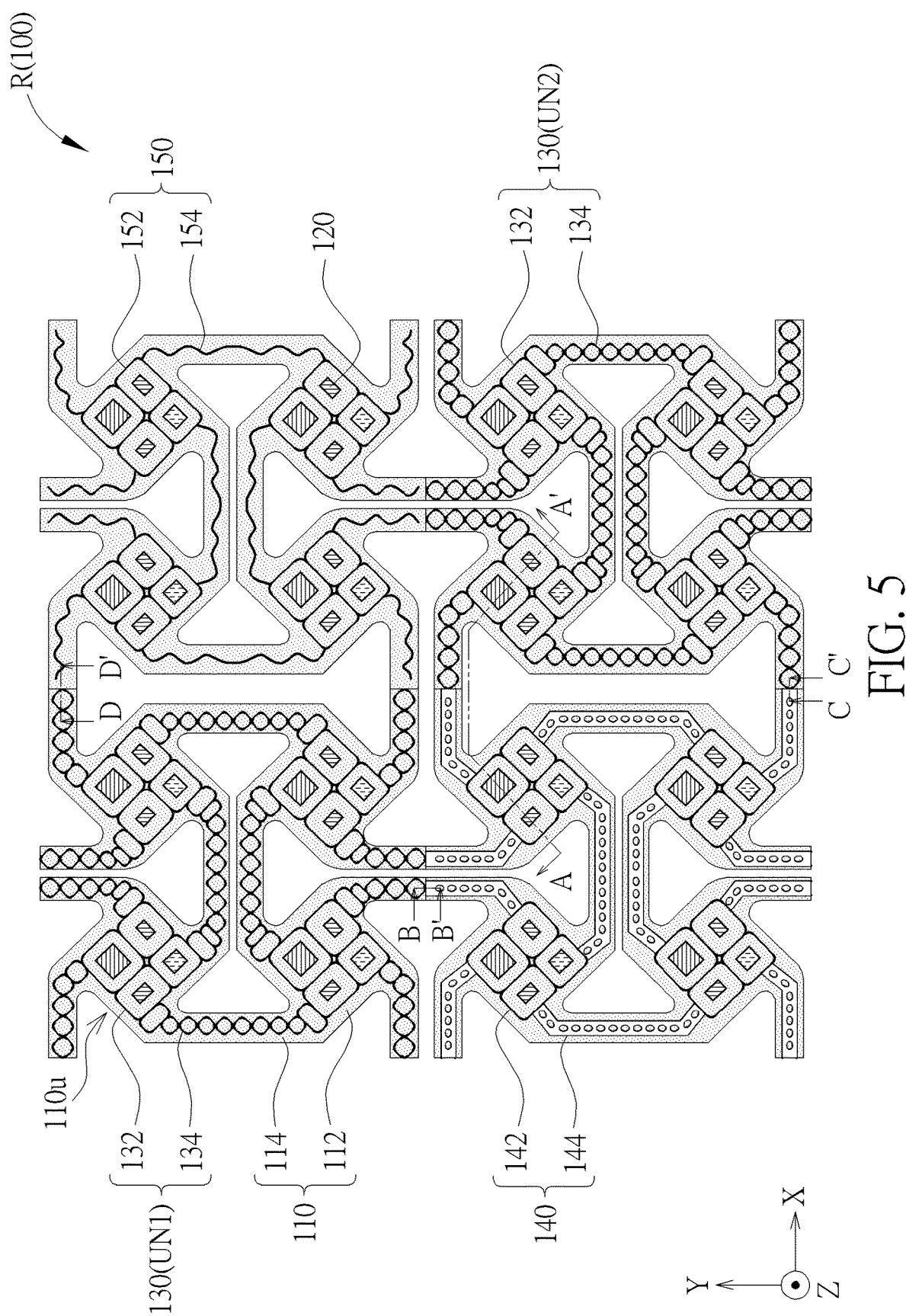
FIG. 5 is an enlarge diagram illustrating a region R of FIG. 4.

Referring to FIG. 4 to FIG. 9, and referring to FIG. 1, FIG. 4 is a schematic diagram showing a top view of a portion of the electronic device according to the first embodiment of the present disclosure, FIG. 5 is an enlarge diagram illustrating a region R of FIG. 4, and FIG. 6 to FIG. 9 are schematic diagrams showing cross-sectional views of structures taken along cross-sectional lines A-A', B-B', C-C' and D-D' in FIG. 5 respectively, wherein an object BS shown in FIG. 6 to FIG. 9 is any object where the electronic device 100 can be disposed, the object BS may be, but not limited to, windshield, window, rear mirror, instrument panel, steering wheel, animal or human, and the first electronic unit 120 is the light emitting component LE as an example. As shown in FIG. 4, the electronic device 100 may include a plurality of uniting units UN, and each uniting unit UN may include a plurality of second electronic units 130 connected to each other. For instance, in FIG. 4, each uniting unit UN may include five second electronic units 130, and five second electronic units 130 may be connected to each other to form a "+" shape; namely, each uniting unit UN may be disposed on the multiple substrate units 110u of the stretchable substrate 110, but not limited thereto. In some embodiments (as shown in FIG. 4), the uniting units UN may include a plurality of first uniting units UN1 and a plurality of second uniting unit UN2, and the first uniting unit UN1 and the second uniting unit UN2 are not directly connected to each other. For example, if the second electronic unit 130 is configured to perform the touch sensing function, the uniting unit UN may be a sensing electrode, wherein the first uniting unit UN1 may be such as a signal sending electrode (e.g., Tx electrode), and the second uniting unit UN2 may be such as a signal receiving electrode (e.g., Rx electrode), such that the uniting units UN including the second electronic units 130 may be a capacitive touch sensor, but not limited thereto.

In the present disclosure, the arrangements and connections of the first uniting units UN1 and the second uniting units UN2 may be designed based on requirement(s). For instance, the first uniting units UN1 arranged along the direction Y may be electrically connected to each other to form an uniting unit column, the uniting unit columns may be arranged along the direction X, the second uniting units UN2 arranged along the direction X may be electrically connected to each other to form an uniting unit row, and the uniting unit rows may be arranged along the direction Y, but not limited thereto.

The electronic device 100 may further include a plurality of bridge units 140 disposed on the stretchable substrate 110. For example, in FIG. 4, there is a one-to-one correspondence between the bridge unit 140 and the substrate unit 110u of the stretchable substrate 110 (i.e., one bridge unit 140 is disposed on one substrate unit 110u), but not limited thereto. In the present disclosure, each bridge unit 140 may be electrically connected to two adjacent second electronic units 130, and these two adjacent second electronic units 130 may belong to different uniting units UN respectively. In detail, as shown in FIG. 4, the bridge unit 140 may be between two adjacent first uniting units UN1 in the direction Y, so as to be electrically connected to the second electronic units 130 belonging to different first uniting units UN1 respectively, thereby being electrically connected to two adjacent first uniting units UN1; the bridge unit 140 may be between two adjacent second uniting units UN2 in the direction X, so as to be electrically connected to the second electronic units 130 belonging to different the second uniting units UN2 respectively, thereby being electrically connected to two adjacent second uniting units UN2. Note that, the bridge unit 140 is electrically connected two adjacent first uniting units UN1 with a first conductive path and electrically connected two adjacent second uniting units UN2 with a second conductive path, and the first conductive path is different from the second conductive path, such that the first uniting unit UN1 does not conduct to the second uniting unit UN2.

Similarly, the bridge unit 140 may include a mesh pattern 142 disposed on the island portion 112 and a connection pattern 144 disposed on the bridge portion 114 (as shown in FIG. 5). Details of the mesh pattern 142 and the connection pattern 144 may be referred to the mesh pattern 132 and the connection pattern 134 of the second electronic unit 130 described above, and these parts will not be redundantly described.

Optionally, the electronic device 100 may further include a plurality of dummy units 150 disposed on the stretchable substrate 110. For instance, in FIG. 4, there is a one-to-one correspondence between the dummy unit 150 and the substrate unit 110u of the stretchable substrate 110 (i.e., one dummy unit 150 is disposed on one substrate unit 110u), but not limited thereto. In the present disclosure, the dummy unit 150 may be disposed between and electrically insulated from two adjacent second electronic units 130, wherein these two adjacent second electronic units 130 may respectively belong to different uniting units UN. In some embodiments, the dummy unit 150 may be configured to separate the first uniting unit UN1 from the second uniting unit UN2.

Optionally, the dummy unit 150 may include a mesh pattern 152 disposed on the island portion 112 and/or a connection pattern 154 disposed on the bridge portion 114 (as shown in FIG. 5). Details of the mesh pattern 152 and the connection pattern 154 may be referred to the mesh pattern 132 and the connection pattern 134 of the second electronic unit 130 described above, and these parts will not be redundantly described.

FIG. 5 shows four substrate units 110u and the structures disposed on them in the region R, wherein the second electronic unit 130 of the first uniting unit UN1, the second electronic unit 130 of the second uniting unit UN2, the bridge unit 140 and the dummy unit 150 are respectively disposed on these four substrate units 110u. In the present disclosure, the mesh pattern 132, the mesh pattern 142 and the mesh pattern 152 disposed on different substrate units 110u may have the same design or different designs based on requirement(s), and the connection pattern 134, the connection pattern 144 and the connection pattern 154 disposed on different substrate units 110u may have the same design or different designs based on requirement(s). In some embodiments (as shown in FIG. 5), the mesh pattern 132, the mesh pattern 142 and the mesh pattern 152 disposed on different substrate units 110u (disposed on the island portions 112) may have the same design, and the connection pattern 134, the connection pattern 144 and the connection pattern 154 disposed on different substrate units 110u (disposed on the bridge portions 114) may have different designs. For instance, in FIG. 5, the connection pattern 134 of the second electronic unit 130 of the first uniting unit UN1 may be the same as the connection pattern 134 of the second electronic unit 130 of the second uniting unit UN2 (e.g., the disconnection-preventing design DSNa shown in FIG. 3), the connection pattern 134 of the second electronic unit 130 of the first uniting unit UN1 may be different from the connection pattern 144 of the bridge unit 140 (e.g., the disconnection-preventing design DSNc shown in FIG. 3) and the connection pattern 154 of the dummy unit 150 (e.g., the disconnection-preventing design DSNf shown in FIG. 3), and the connection pattern 144 of the bridge unit 140 may be different from the connection pattern 154 of the dummy unit 150, but not limited thereto.

Figure 6:
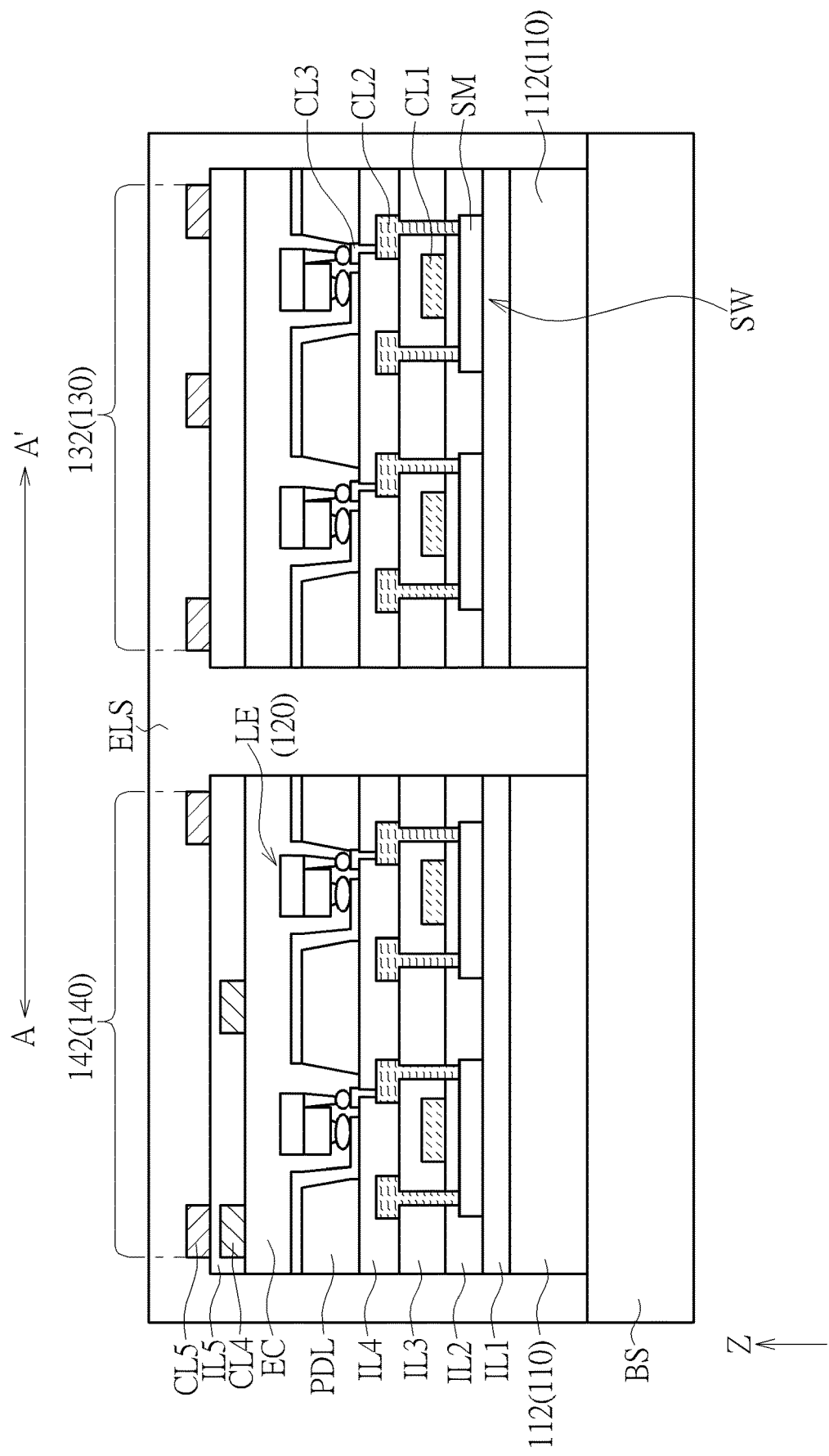
FIG. 6 is a schematic diagram showing a cross-sectional view of a structure taken along a cross-sectional line A-A' in FIG. 5.
Figure 7:
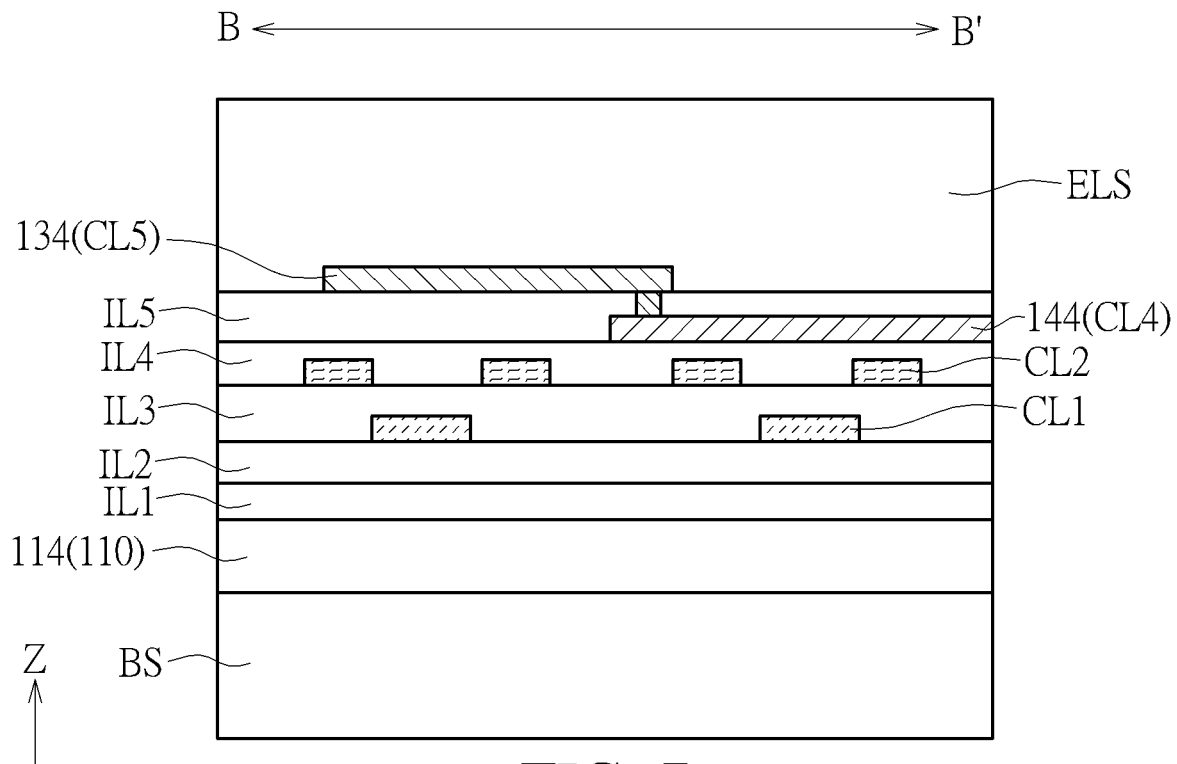
FIG. 7 is a schematic diagram showing a cross-sectional view of a structure taken along a cross-sectional line B-B' in FIG. 5.
Figure 8:
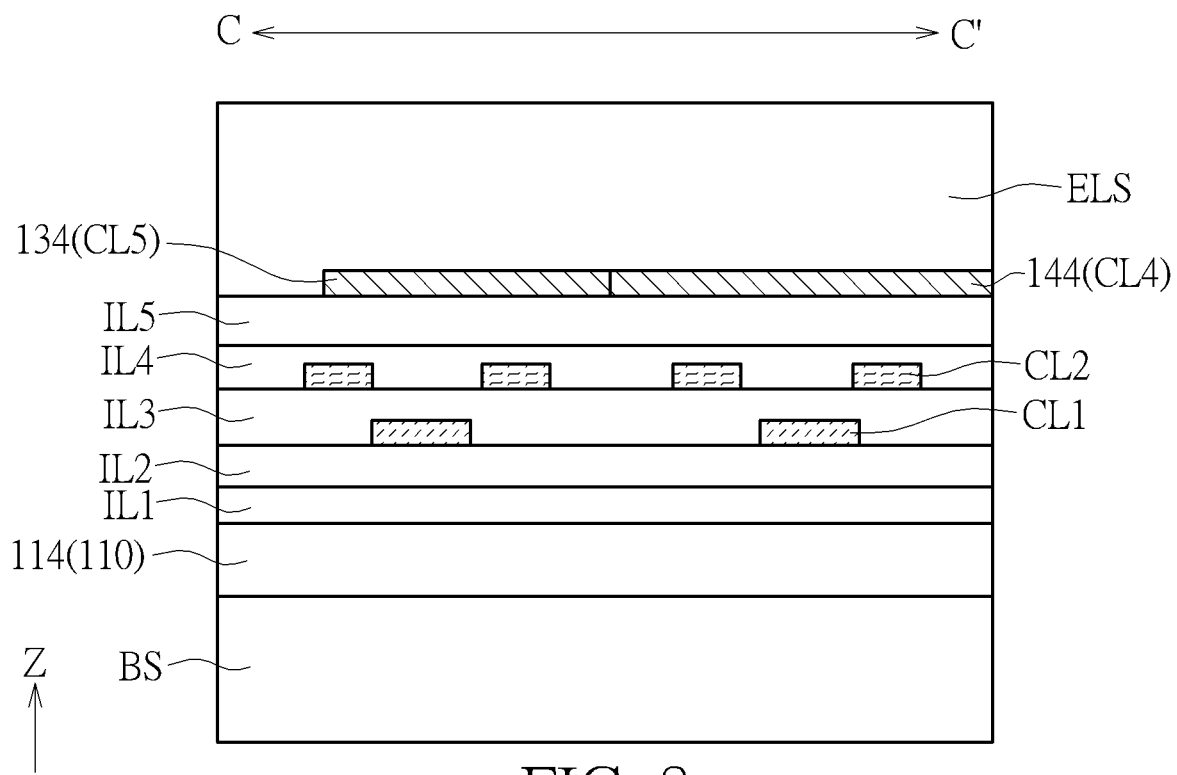
FIG. 8 is a schematic diagram showing a cross-sectional view of a structure taken along a cross-sectional line C-C' in FIG. 5.

As shown in FIG. 5 to FIG. 8, for instance, the mesh pattern 132 and the connection pattern 134 of the second electronic unit 130 may be a single-layer conductive layer (e.g., a conductive layer CL5), the mesh pattern 132 of the bridge unit 140 may include a plurality of conductive layers (e.g., a conductive layer CL4 and a conductive layer CL5), and the connection pattern 144 of the bridge unit 140 may be a single-layer conductive layer or include a plurality of conductive layers, but not limited thereto. In some embodiments (as shown in FIG. 6), some portions of the mesh pattern 142 of the bridge unit 140 may have one conductive layer (e.g., the conductive layer CL4 or the conductive layer CL5), other portion(s) of the mesh pattern 142 of the bridge unit 140 may include a plurality of conductive layers (e.g., the conductive layer CL4 and the conductive layer CL5), and these portions may complement each other in the top view, so as to achieve a visual effect of the mesh pattern 132 in the top view, but not limited thereto. In some embodiments, the whole mesh pattern 142 of the bridge unit 140 may include a plurality of conductive layers (e.g., the conductive layer CL4 and the conductive layer CL5), but not limited thereto.

The connection pattern 144 of the bridge unit 140 may be connected to the connection pattern 134 of the second electronic unit 130 of the first uniting unit UN1 or the connection pattern 134 of the second electronic unit 130 of the second uniting unit UN2 based on requirement(s). As shown in FIG. 5 to FIG. 8, the connection pattern 134 (e.g., the conductive layer CL5) of the second electronic unit 130 of the first uniting unit UN1 may be connected to the connection pattern 144 (e.g., the conductive layer CL4) of the bridge unit 140 through a hole passing through an insulating layer IL5, and the connection pattern 134 (e.g., the conductive layer CL5) of the second electronic unit 130 of the second uniting unit UN2 may be directly connected to the connection pattern 144 (e.g., the conductive layer CL5) of the bridge unit 140; that is to say, a structure of the bridge unit 140 connected to the first uniting unit UN1 may be disposed in the conductive layer CL4, and another structure of the bridge unit 140 connected to the second uniting unit UN2 may be disposed in the conductive layer CL5, but not limited thereto.

Figure 9:
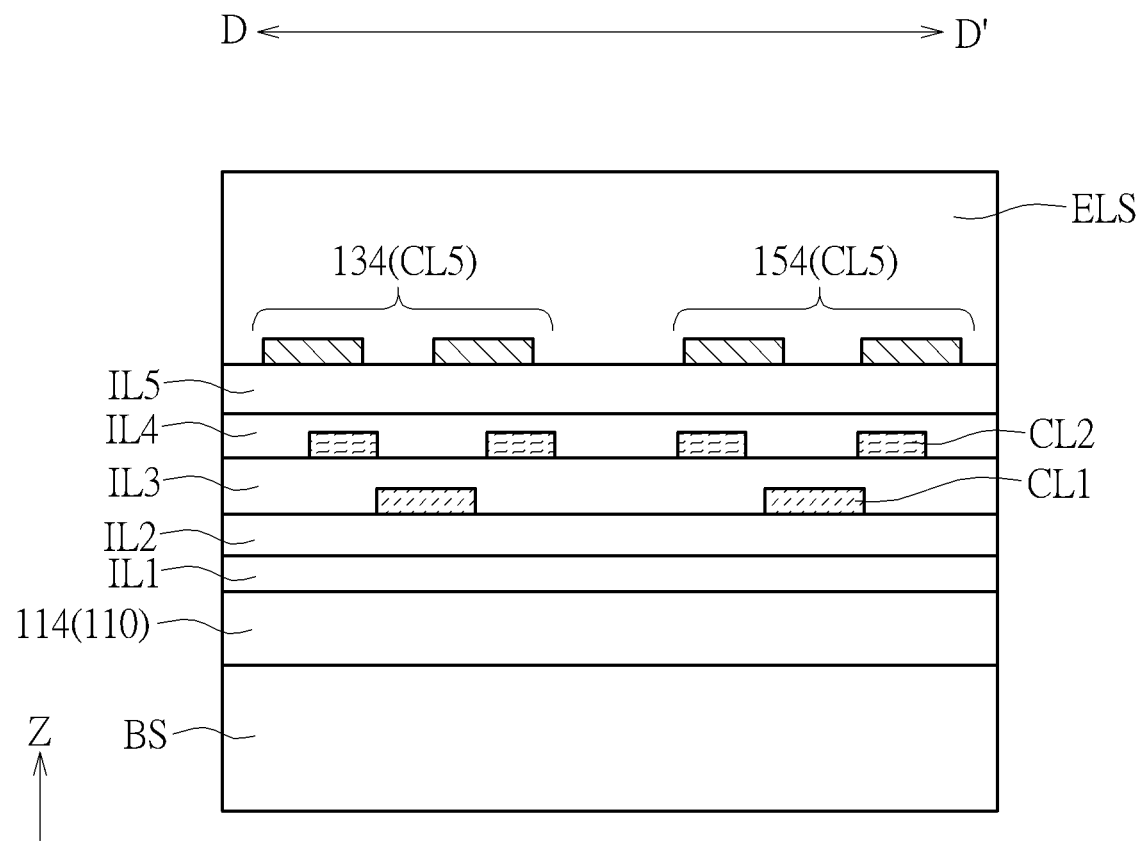
FIG. 9 is a schematic diagram showing a cross-sectional view of a structure taken along a cross-sectional line D-D' in FIG. 5.

In FIG. 5 and FIG. 9, the connection pattern 154 of the mesh pattern 152 of the dummy unit 150 may be electrically insulated from the second electronic unit 130 of the first uniting unit UN1, the second electronic unit 130 of the second uniting unit UN2 and the bridge unit 140. In some embodiments, the dummy unit 150 may not have the connection pattern 154 so as not to be connected to the second electronic unit 130 and the bridge unit 140.

In the present disclosure, the electronic device 100 may optionally include other suitable component and/or structure. In FIG. 6 to FIG. 9, the electronic device 100 may further include at least one conductive layer (e.g., a conductive layer CL1, a conductive layer CL2 and a conductive layer CL3), at least one insulating layer (e.g., an insulating layer IL1, an insulating layer IL2, an insulating layer IL3, an insulating layer IL4, an insulating layer IL5) and at least one semiconductor layer, so as to form the needed component(s) and/or structure(s), such as a transistor SW, a scan line and a data line. The transistor SW may be electrically connected to the first electronic unit 120 (the light emitting component LE), the scan line and the data line may be connected between the electronic component in the active region and the electronic component in the peripheral region, the scan line may be configured to transmit switching signal(s) for turning on or turning off the transistor SW, and the data line may be configured to transmit the gray level signal(s) which the light emitting component LE needs, but not limited thereto. In some embodiments (as shown in FIG. 6), the transistor SW may include a semiconductor layer SM, the insulating layer IL2, a gate (e.g., the gate may be included in the conductive layer CL1), a source (e.g., the source may be included in the conductive layer CL2) and a drain (e.g., the drain may be included in the conductive layer CL2), the scan line may be included in the conductive layer CL1, and the data line may be included in the conductive layer CL2, but not limited thereto. Note that, the material of the semiconductor layer SM may include such as poly-silicon, amorphous silicon, metal-oxide semiconductor (e.g., IGZO), other suitable semiconductor materials or a combination thereof, but not limited thereto.

The electronic device 100 may further include a pixel defining layer PDL disposed between two light emitting components LE or two sub-pixels SP, so as to separate the light emitting components LE or the sub-pixels SP. The pixel defining layer PDL may be a single-layer structure or a composite structure, and may include an insulating material (organic insulating material or inorganic insulating material), a reflective material, other suitable material(s) or a combination thereof, but not limited thereto.

The electronic device 100 may optionally include an encapsulating layer EC, so as to encapsulate and protect the first electronic unit 120 (the light emitting component LE), wherein the encapsulating layer EC may include organic insulating material or other suitable encapsulating material. In FIG. 6, the second electronic unit 130 may be disposed on the encapsulating layer EC, but not limited thereto.

In FIG. 6 to FIG. 9, the electronic device 100 may optionally include an elastic material layer ELS disposed on the first electronic unit 120 and the second electronic unit 130. The elastic material layer ELS may also be disposed in the region where the stretchable substrate 110 does not exist (i.e., some portions of the elastic material layer ELS may be respectively disposed between two island portions 112, between two bridge portions 114 and between two substrate units 110u), so as to improve the structural strength and reliability of the electronic device 100. The elastic material layer ELS may include such as transparent elastic insulating material, but not limited thereto.

The electronic device of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 10:
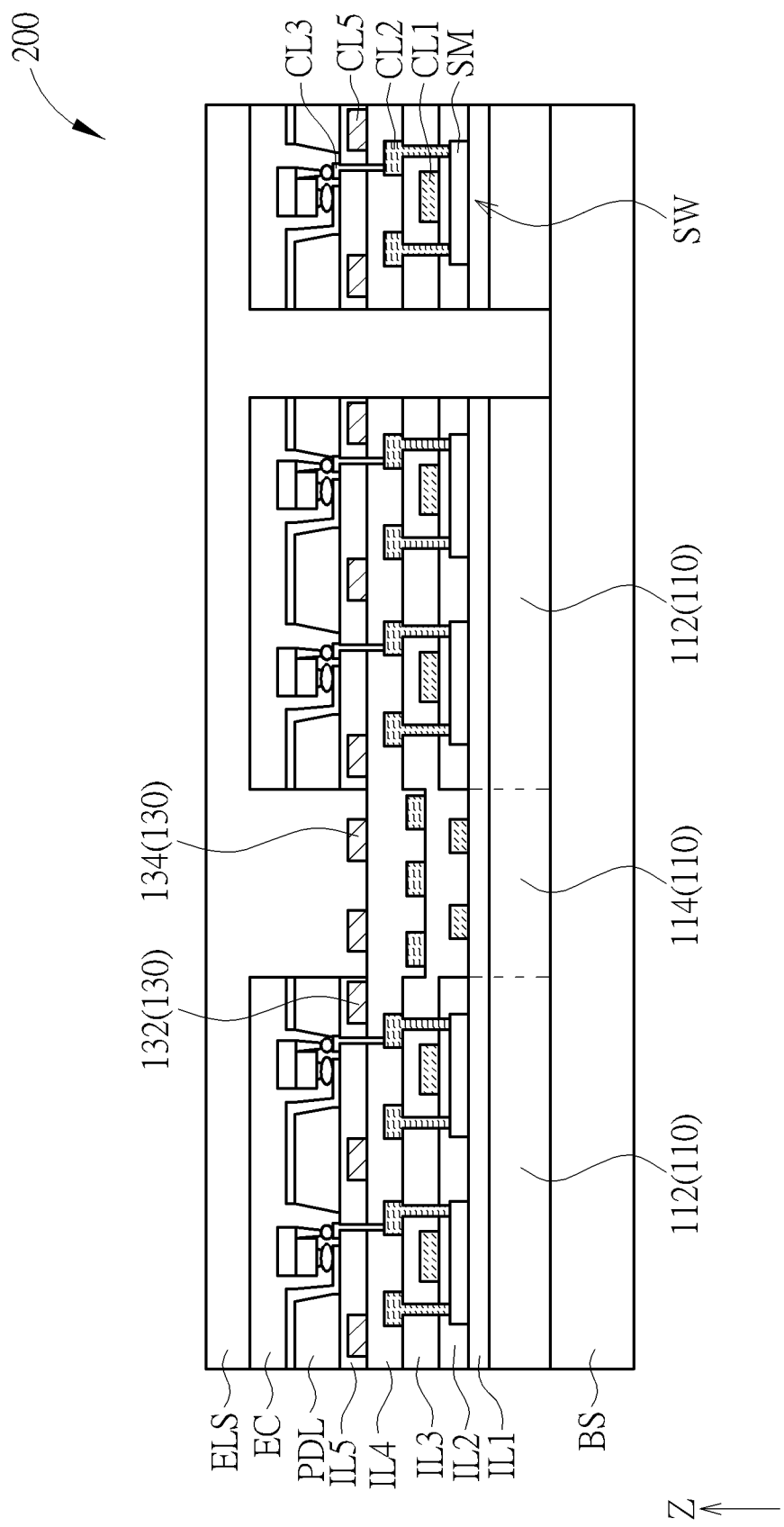
FIG. 10 is a schematic diagram showing a cross-sectional view of an electronic device according to a second embodiment of the present disclosure.

Referring to FIG. 10, FIG. 10 is a schematic diagram showing a cross-sectional view of an electronic device according to a second embodiment of the present disclosure. As shown in FIG. 10, a difference between this embodiment and the first embodiment is the position of the second electronic unit 130 of the electronic device 200. In FIG. 10, the second electronic unit 130 may be disposed between the first electronic unit 120 (the light emitting component LE) and the transistor SW, but not limited thereto.

Figure 11:
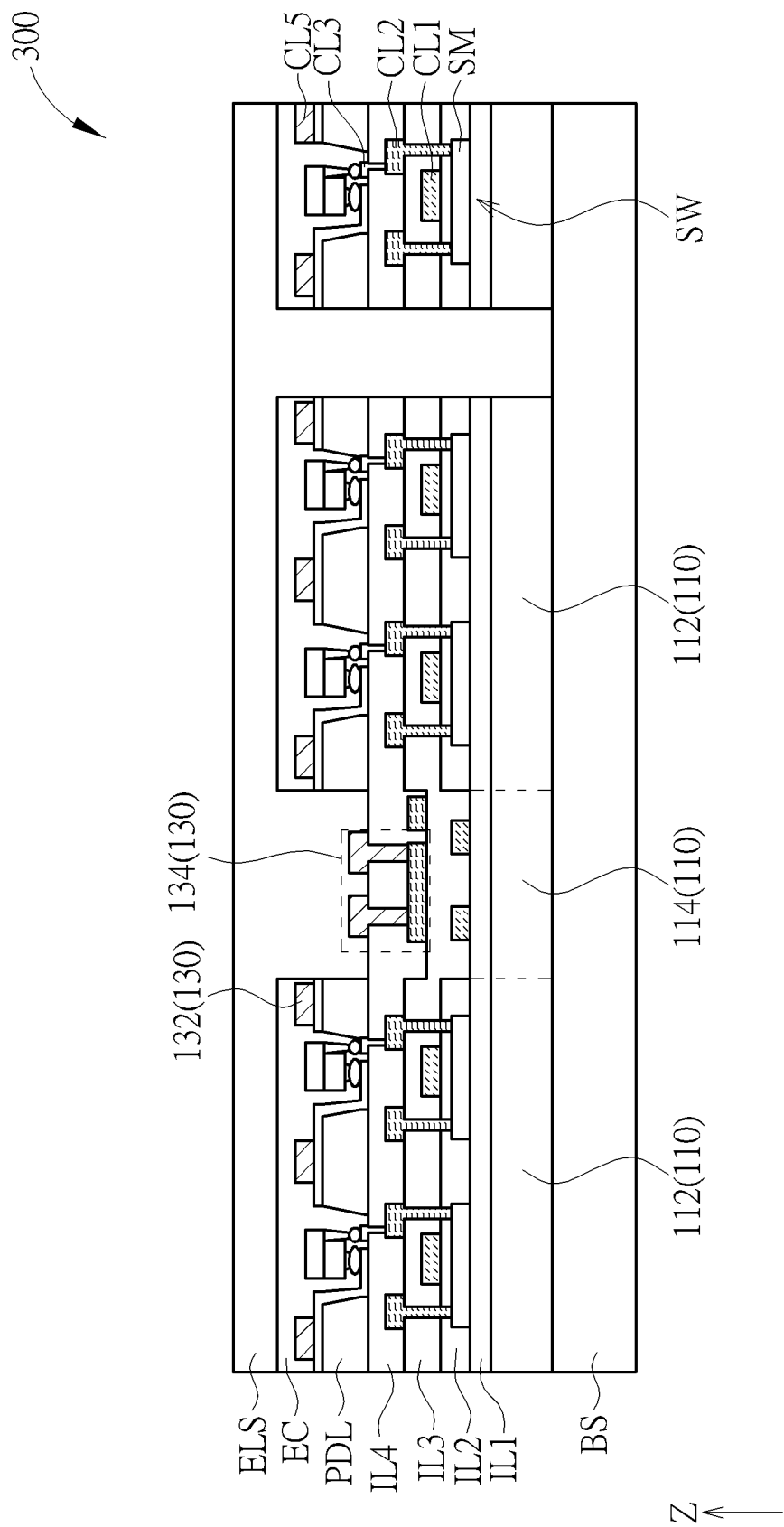
FIG. 11 is a schematic diagram showing a cross-sectional view of an electronic device according to a third embodiment of the present disclosure.

Referring to FIG. 11, FIG. 11 is a schematic diagram showing a cross-sectional view of an electronic device according to a third embodiment of the present disclosure. As shown in FIG. 11, a difference between this embodiment and the first embodiment is the position of the second electronic unit 130 of the electronic device 300. In FIG. 11, the second electronic unit 130 may be disposed between the encapsulating layer EC and the pixel defining layer PDL, but not limited thereto. Moreover, in the connection pattern 134 on the bridge portion 114 of the stretchable substrate 110, the connection pattern 134 may be a multi-layer structure including the conductive layer CL5 and the conductive layer CL2. In the connection pattern 134, a portion included in the conductive layer CL5 may be electrically connected to another portion included in the conductive layer CL2 through a hole passing through the insulating layer IL4, such that the conductive layer CL2 may include the source and the drain of the transistor SW and the another portion of the connection pattern 134 of the second electronic unit 130. In some embodiments, the connection pattern 134 may horizontally extend through the another portion included in the conductive layer CL2, but not limited thereto. In some embodiments, if the connection pattern 144 of the bridge unit 140 has this design, the number of conductive layers used in the electronic device 300 may be reduced, thereby reducing the cost of the electronic device 300.

Figure 12:
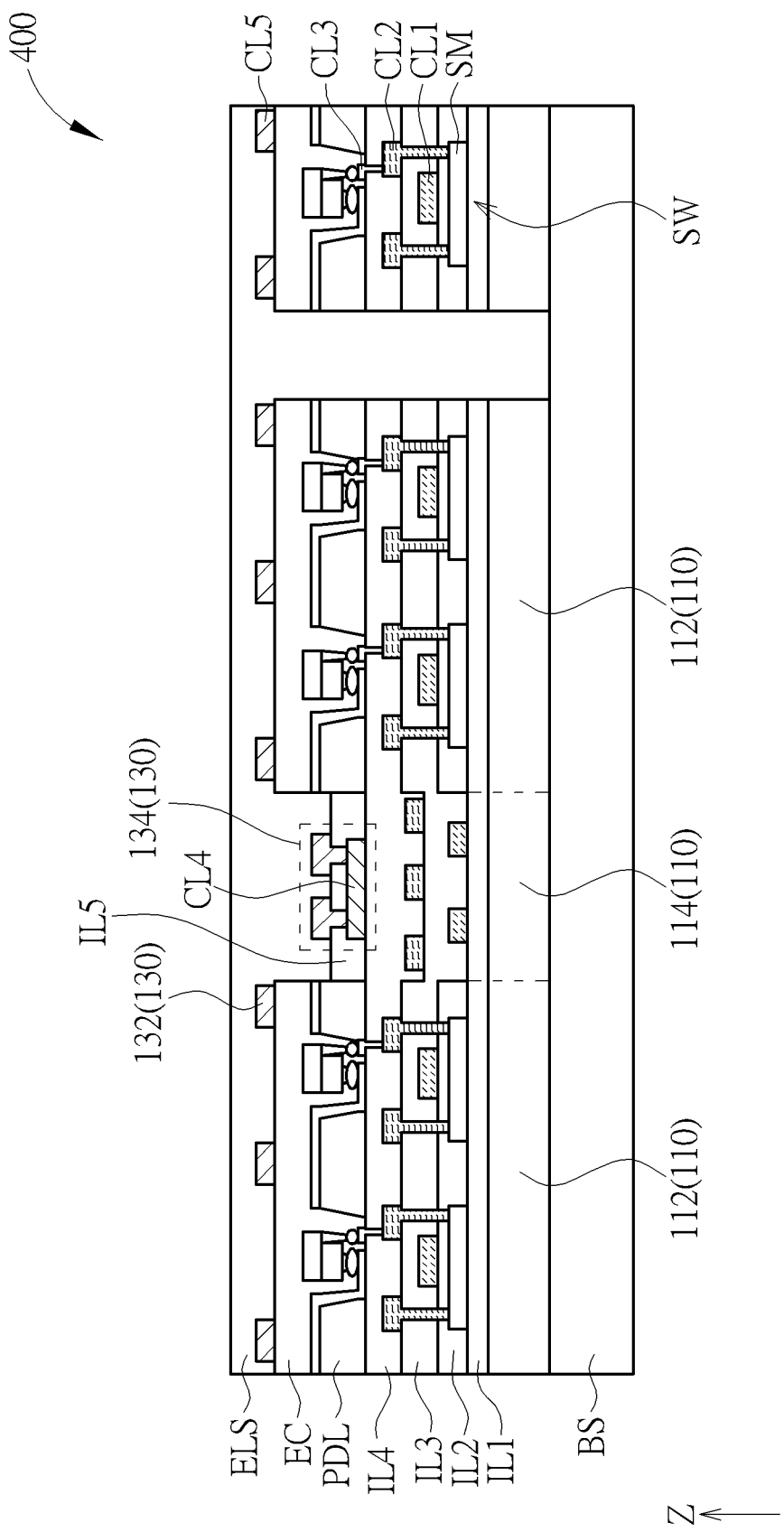
FIG. 12 is a schematic diagram showing a cross-sectional view of an electronic device according to a fourth embodiment of the present disclosure.

Referring to FIG. 12, FIG. 12 is a schematic diagram showing a cross-sectional view of an electronic device according to a fourth embodiment of the present disclosure. As shown in FIG. 12, a difference between this embodiment and the first embodiment is the design of the connection pattern 134 of the second electronic unit 130 of the electronic device 400. In FIG. 12, in the connection pattern 134 on the bridge portion 114 of the stretchable substrate 110, the connection pattern 134 may be a multi-layer structure including the conductive layer CL4 and the conductive layer CL5. In the connection pattern 134, a portion included in the conductive layer CL5 may be electrically connected to another portion included in the conductive layer CL4 through a hole passing through the insulating layer. In some embodiments, the connection pattern 134 may horizontally extend through the another portion included in the conductive layer CL4, but not limited thereto.

Figure 13:
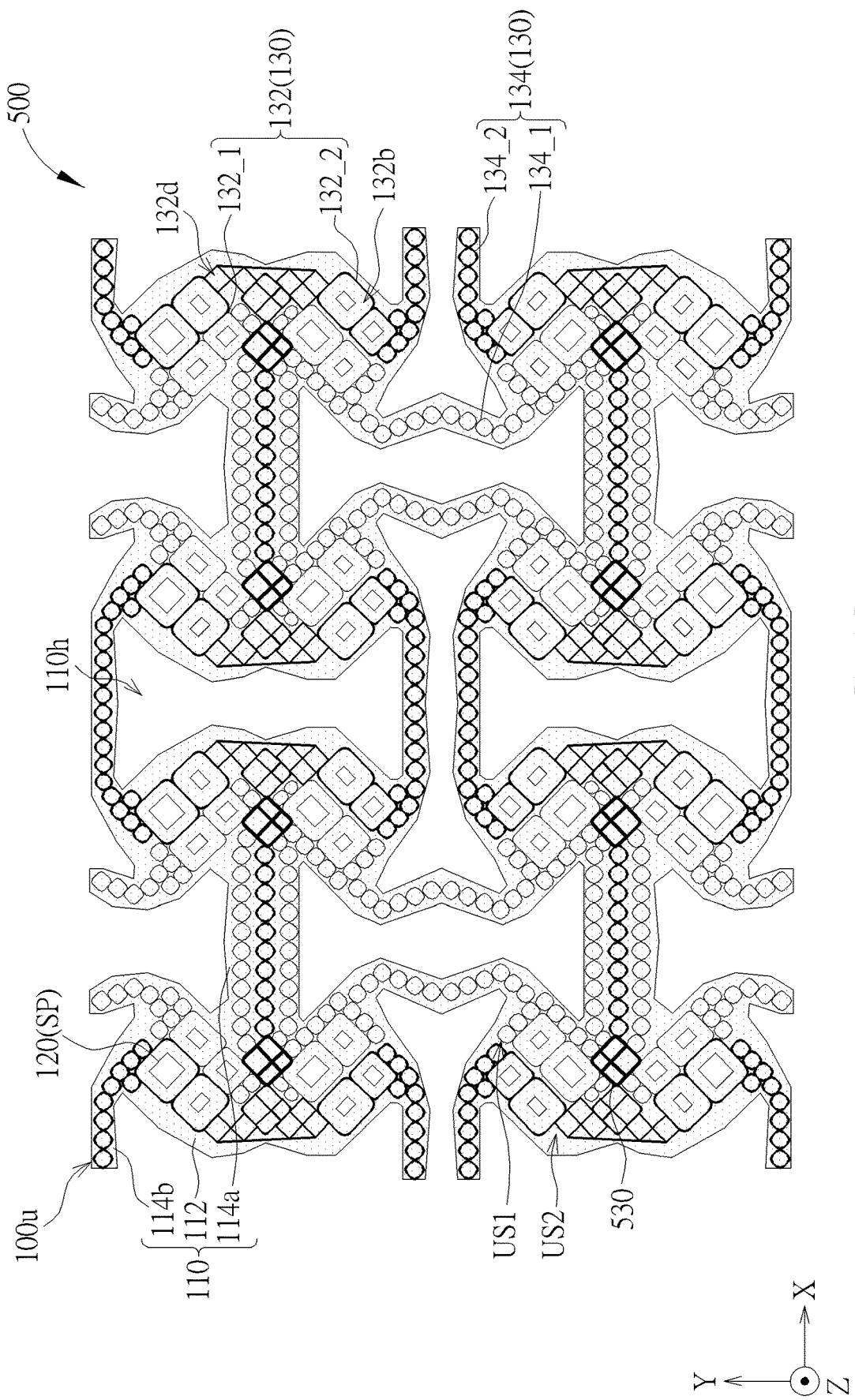
FIG. 13 is a schematic diagram showing a cross-sectional view of an electronic device according to a fifth embodiment of the present disclosure.

Referring to FIG. 13, FIG. 13 is a schematic diagram showing a cross-sectional view of an electronic device according to a fifth embodiment of the present disclosure. As shown in FIG. 13, differences between this embodiment and the first embodiment are the design of the stretchable substrate 110 of the electronic device 500 and the configurations of the first electronic unit 120 and the second electronic unit 130 of the electronic device 500. In FIG. 13, the island portion 112 may be U-shaped, one island portion 112 may be directly connected to five bridge portions 114, and each substrate unit 110u may include two island portions 112 and nine bridge portions 114 directly connected to these island portions 112, wherein one first bridge portion 114a may be connected between these island portions 112, and each of one ends of eight second bridge portions 114b may be connected to the island portion 112 of other substrate unit 110u. In some embodiments (as shown in FIG. 13), a width of the first bridge portion 114a may be greater than a width of the second bridge portion 114b, but not limited thereto. In some embodiments (as shown in FIG. 13), the stretchable substrate 110 may have a H-shaped hole 110h, and the top view pattern of two ends of the H-shaped hole 110h may be similar to a triangle, but not limited thereto.

For example, as shown in FIG. 13, one island portion 112 may have two pixels, and one pixel may include such as four sub-pixels SP, but not limited thereto. In one island portion 112 shown in FIG. 13, two pixels are disposed on two sides of the first bridge portion 114a in the top view, but not limited thereto.

As shown in FIG. 13, in one second electronic unit 130, the mesh pattern 132 may include at least one first mesh pattern 132_1 and at least one second mesh pattern 132_2, the connection pattern 134 may include at least one first connection pattern 134_1 and at least one second connection pattern 134_2, wherein the first mesh pattern(s) 132_1 and the first connection pattern(s) 134_1 may be electrically connected to each other to form a first sub-unit US1, and the second mesh pattern 132_2 and the second connection pattern 134_2 may be electrically connected to each other to form a second sub-unit US2. The first sub-unit US1 and the second sub-unit US2 may not be directly connected to each other, such that the first sub-unit US1 and the second sub-unit US2 may be electrically insulated from each other and/or may not conduct to each other. In FIG. 13, in one second electronic unit 130, the first connection pattern(s) 134_1 may be disposed on at least one second bridge portion 114b, the second connection pattern(s) 134_2 may be disposed on at least one second bridge portion 114b, and the first connection pattern(s) 134_1 and the second connection pattern(s) 134_2 may be disposed on the first bridge portion 114a, but not limited thereto. In FIG. 13, in one second electronic unit 130, the first connection pattern 134_1 on the first bridge portion 114a may be electrically connected to the first mesh patterns 132_1 respectively disposed on two different island portions 112, and the second connection pattern 134_2 on the first bridge portion 114a may be electrically connected to the second mesh patterns 132_2 respectively disposed on two different island portions 112, but not limited thereto. Moreover, the second electronic unit 130 may further include a bridge component 530 disposed at the connecting position of the first bridge portion 114a and the island portion 112, the bridge component 530 may be electrically connected to the first connection pattern 134_1 on the first bridge portion 114a and the first mesh pattern 132_1 through a first conductive path, and the bridge component 530 may be electrically connected to the second connection pattern 134_2 on the first bridge portion 114a and the second mesh pattern 132_2 through a second conductive path, wherein the first conductive path is different from the second conductive path (e.g., conductive structures respectively in the different conductive layers of the bridge component 530 may serve as the first conductive path and the second conductive path respectively), such that the first sub-unit US1 does not conduct to the second sub-unit US2. In FIG. 13, in order to distinguish the first sub-unit US1, the second sub-unit US2 and the bridge component 530, the first sub-unit US1 is shown with the finest line, the second sub-unit US2 is shown with the medium line, and the bridge component 530 is shown with the coarsest line, but the line widths of these structures of the present disclosure are not limited thereto. In some embodiments, the line width of the first sub-unit US1, the line width of the second sub-unit US2 and the line width of the bridge component 530 may be the same. It can be known that, one second electronic unit 130 shown in FIG. 13 may include one first sub-unit US1, one second sub-unit US2 and two bridge components 530, the first sub-unit US1 may include all first mesh patterns 132_1 and all first connection patterns 134_1 disposed on one substrate unit 110*u*, the second sub-unit US2 may include all second mesh patterns 132_2 and all second connection patterns 134_2 disposed on one substrate unit 110*u*, and a portion of the first sub-unit US1, a portion of the second sub-unit US2 and one bridge component 530 may be disposed on one island portion 112.

In the present disclosure, the arrangements and the connections of the first sub-units US1 and the second sub-units US2 may be designed based on requirement(s). For example, the first sub-units US1 arranged along the direction Y may be electrically connected to each other to form a sub-unit column, the sub-unit columns may be arranged along the direction X, the second sub-units US2 arranged along the direction X may be electrically connected to each other to form a sub-unit row, and the sub-unit rows may be arranged along the direction Y, but not limited thereto.

In addition, in the mesh pattern 132 of the second electronic unit 130 shown in FIG. 13, some portions of the mesh pattern 132 (e.g., a portion of the first mesh pattern 132_1 and a portion of the second mesh pattern 132_2) may have the first opening 132*b* overlapping at least one first electronic unit 120, other portions of the mesh pattern 132 (e.g., another portion of the first mesh pattern 132_1 and another portion of the second mesh pattern 132_2) may have a fourth opening 132*d* not overlapping the first electronic unit 120, but not limited thereto.

Figure 14:
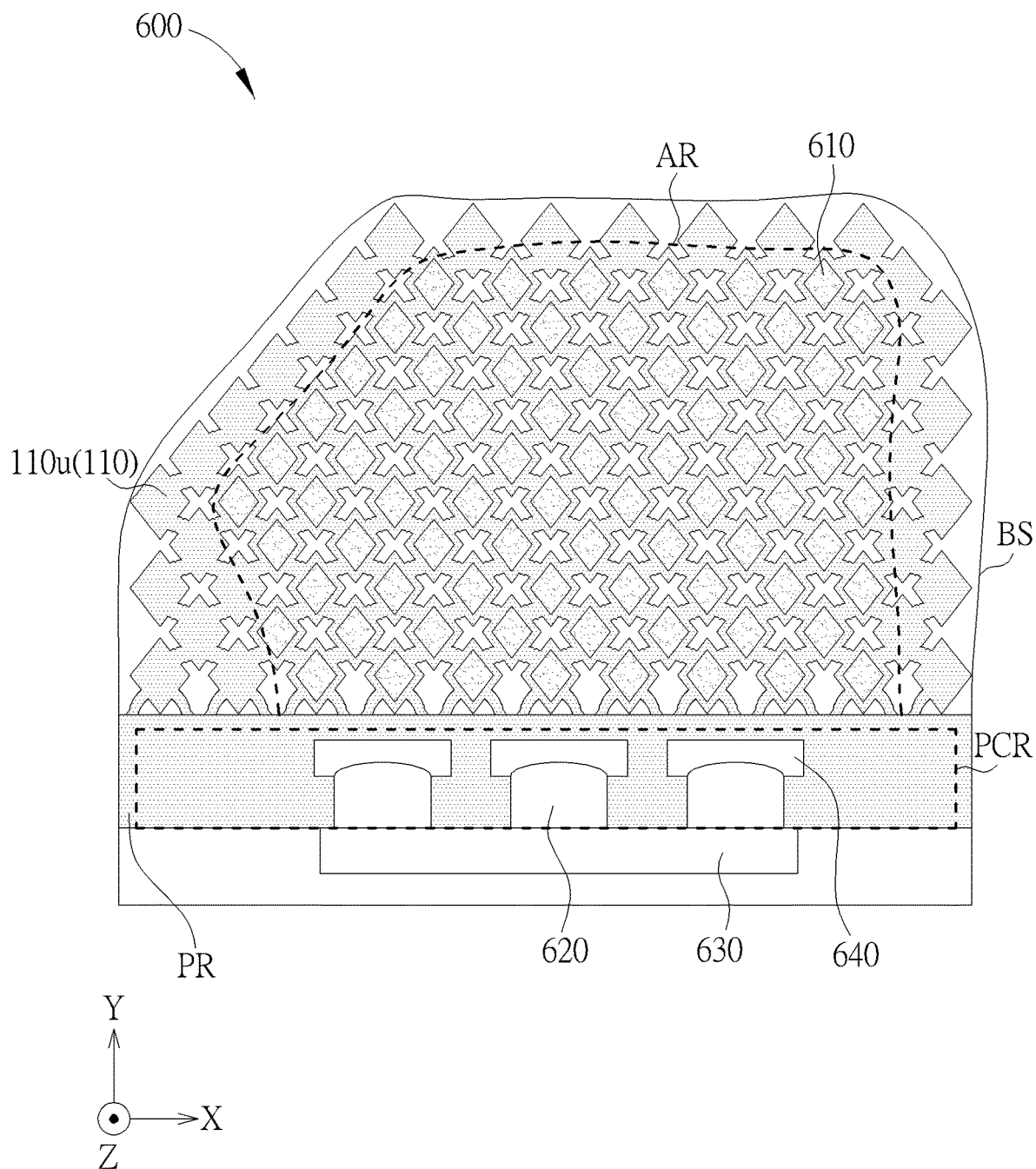
FIG. 14 is a schematic diagram showing a cross-sectional view of an electronic device according to a sixth embodiment of the present disclosure.

Referring to FIG. 14, FIG. 14 is a schematic diagram showing a cross-sectional view of an electronic device according to a sixth embodiment of the present disclosure. For instance, the electronic device 600 shown in FIG. 14 may be disposed on the window of the vehicle, but the electronic device 600 of the present disclosure may be disposed on any suitable object BS based on requirement(s). In the present disclosure, the configurations the active region AR and the peripheral region PR may be designed based on requirement(s). The electronic components 610 (e.g., the first electronic unit 120 and the second electronic unit 130) having the function corresponding to the active region AR may be disposed on the substrate units 110*u* (or the island portions 112) of the active region AR, and the peripheral region PR may be disposed on at least one outer side of the active region AR. For instance, in FIG. 14, the peripheral region PR may surround the active region AR, but not limited thereto. Note that, if the peripheral region PR includes the substrate units 110*u* (or the island portions 112) of the stretchable substrate 110, the electronic component 610 (e.g., the first electronic unit 120 and the second electronic unit 130) having the function corresponding to the active region AR may not be disposed on these substrate units 110*u* (or the island portions 112).

In some embodiments, the peripheral region PR may include a peripheral circuit region PCR. For instance, in FIG. 13, the peripheral circuit region PCR may be disposed on a lower side of the active region AR, but not limited thereto. In some embodiments, a driving component configured to drive the electronic component 610 in the active region AR may be disposed in the peripheral circuit region PCR. Optionally, connecting pads 640 may be disposed in the peripheral circuit region PCR, and a circuit board 630 may be electrically connected to the connecting pads 640 through connecting components 620, such that electronic component(s) on the circuit board 630 may be electrically to the driving component in the peripheral circuit region PCR, but not limited thereto.

In summary, because of the patterned design of the stretchable substrate and the design of the electronic units disposed on the stretchable substrate, the effect and the reliability of the electronic device would be enhanced when the electronic device is stretched and/or deformed, and the lifetime of the electronic device would be increased.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a stretchable substrate having a plurality of island portions and a plurality of bridge portions, each of the bridge portions connecting at least two of the island portions;
   a plurality of first electronic units disposed on the plurality of island portions; and
   a plurality of second electronic units disposed on the stretchable substrate, each of the second electronic units comprising a mesh pattern disposed on at least one of the island portions, the mesh pattern comprising a first opening overlapped with at least one of the plurality of first electronic units;
   wherein the plurality of second electronic units are sensing electrodes, and the mesh pattern is a portion of the sensing electrodes.

2. The electronic device according to claim 1, wherein each of the second electronic units further comprises a connection pattern disposed on at least one of the bridge portions and the connection pattern comprises a second opening.

3. The electronic device according to claim 2, wherein the first opening has a first area, the second opening has a second area and the first area is greater than the second area.

4. The electronic device according to claim 3, wherein a ratio of the first area to the second area is greater than 50 and less than or equal to 5000.

5. The electronic device according to claim 3, wherein the second opening is in a shape of circle, oval, rhombus, or bar.

6. The electronic device according to claim 1, wherein the mesh pattern further comprises a third opening overlapped with at least another one of the plurality of first electronic units, the first opening has a first area, the third opening has a third area and a ratio of the first area to the third area is greater than 1 and less than or equal to 5.

7. The electronic device according to claim 1, wherein each of the second electronic units further comprises a connection pattern disposed on at least one of the bridge portions and the connection pattern has a wavy shape.

8. The electronic device according to claim 1, wherein one of the second electronic units is disposed on at least two of the island portions.

9. The electronic device according to claim 1, further comprising a plurality of bridge units disposed on the stretchable substrate, wherein each of the bridge units electrically connects two adjacent ones of the second electronic units.

10. The electronic device according to claim 1, further comprising a plurality of dummy units disposed on the stretchable substrate, wherein the plurality of dummy units are disposed between and electrically insulated from two adjacent ones of the second electronic units.

11. The electronic device according to claim 1, wherein the plurality of first electronic units are light emitting diodes.

12. The electronic device according to claim 1, wherein the plurality of first electronic units are photodiodes.

13. The electronic device according to claim 1, wherein the plurality of second electronic units are touch electrodes.

14. The electronic device according to claim 1, wherein the plurality of second electronic unit are configured to sense a stylus pen.

15. The electronic device according to claim 1, wherein the plurality of second electronic units are configured to receive or transmit electromagnetic wave.

* * * * *